United States Patent
Yuasa et al.

(10) Patent No.: US 7,071,522 B2
(45) Date of Patent: Jul. 4, 2006

(54) MAGNETORESISTANCE EFFECT ELEMENT, MAGNETIC HEAD AND MAGNETIC REPRODUCING APPARATUS

(75) Inventors: Hiromi Yuasa, Kanagawa-ken (JP); Yuzo Kamiguchi, Kanagawa-ken (JP); Masatoshi Yoshikawa, Kanagawa-ken (JP); Katsuhiko Koui, Kanagawa-ken (JP); Hitoshi Iwasaki, Kanagawa-ken (JP); Tomohiko Nagata, Kangawa-ken (JP); Takeo Sakakubo, Kanagawa-ken (JP); Masashi Sahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/887,080

(22) Filed: Jul. 9, 2004

(65) Prior Publication Data
US 2004/0246634 A1    Dec. 9, 2004

Related U.S. Application Data

(63) Continuation of application No. 10/217,410, filed on Aug. 14, 2002, now Pat. No. 6,784,509.

(30) Foreign Application Priority Data
Aug. 15, 2001  (JP) ............................. 2001-246583

(51) Int. Cl.
*H01L 29/82* (2006.01)
*H01L 43/00* (2006.01)

(52) U.S. Cl. ................ 257/421; 257/295; 257/E27.006
(58) Field of Classification Search ................ 257/421, 257/295, E27.006; 360/324.1
See application file for complete search history.

(56) References Cited

U.S. PATENT DOCUMENTS

| | | | |
|---|---|---|---|
| 4,935,311 A * | 6/1990 | Nakatani et al. | 428/611 |
| 5,942,309 A | 8/1999 | Kamijo | 428/141 |
| 6,171,693 B1 | 1/2001 | Lubitz et al. | 428/332 |
| 6,567,247 B1 * | 5/2003 | Araki et al. | 360/324.12 |
| 6,603,642 B1 * | 8/2003 | Araki et al. | 360/324 |
| 6,621,666 B1 * | 9/2003 | Miyauchi et al. | 360/324.12 |
| 6,784,509 B1 * | 8/2004 | Yuasa et al. | 257/421 |
| 2002/0004147 A1 | 1/2002 | Ueno et al. | 428/692 |

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

In a spin valve type element, an interface insertion layer (32, 34) of a material exhibiting large spin-dependent interface scattering is inserted in a location of a magnetically pinned layer (16) or a magnetically free layer (20) closer to a nonmagnetic intermediate layer (18). A nonmagnetic back layer (36) may be additionally inserted as an interface not in contact with the nonmagnetic intermediate layer to increase the output by making use of spin-dependent interface scattering along the interface between the pinned layer and the nonmagnetic back layer or between the free layer and the nonmagnetic back layer.

7 Claims, 16 Drawing Sheets

MAGNETORESISTANCE EFFECT ELEMENT, MAGNETIC HEAD AND MAGNETIC REPRODUCING APPARATUS

CROSS-REFERENCE TO RELATED APPLICATIONS

This application is a continuation of U.S. application Ser. No. 10/217,410 filed Aug. 14, 2002 now U.S. Pat. No. 6,784,509 and further is based upon and claims the benefit of priority from the prior Japanese Patent Application No. 2001-246583, filed on Aug. 15, 2001; the entire contents of each of which are incorporated herein by reference.

BACKGROUND OF THE INVENTION

This invention relates to a magnetoresistance effect element, magnetic head and magnetic reproducing apparatus, and more particularly, to a magnetoresistance effect element structured to flow a sense current perpendicularly of the film surface of a magnetoresistance effect film, as well as a magnetic head and a magnetic reproducing apparatus using the magnetoresistance effect element.

Read-out of information recorded in a magnetic recording medium conventionally relied on a method of moving a reproducing magnetic head having a coil relative to the recording medium and detecting a current induced in the coil by electromagnetic induction then generated. Later, a magnetoresistance effect element was developed, and has been brought into practical use as a magnetic field sensor as well as a magnetic head (MR head) incorporated in a magnetic reproducing apparatus such as a hard disk drive.

For years, magnetic recording mediums have been progressively downsized and enhanced in capacity, and the relative speed between the reproducing magnetic head and the magnetic recording medium during information read-out operation has been decreased accordingly. Under the circumstances, there is the increasing expectation for MR heads capable of extracting large outputs even with small relative speeds.

As an answer to the expectation, it has been reported that multi-layered films, so called an "artificial lattice films", which are made by alternately depositing ferromagnetic metal films and nonmagnetic metal films, such as the combination of Fe layers and Cr layers or the combination of Fe layers and Cu layers, under certain conditions, and bringing closely located ferromagnetic metal films into antiferromagnetic coupling, exhibit giant magnetoresistance effects (see Phys. Rev. Lett. Vol. 61, p2474 (1988), Phys. Rev. Lett., Vol. 64, p2304 (1990), for example). Artificial films, however, need a large magnetic field for magnetic saturation, and are not suitable as film materials for MR heads.

On the other hand, there are reports about realization of a large magnetoresistance effect by using a multi-layered film of the sandwich structure of a ferromagnetic layer on a nonmagnetic layer and a ferromagnetic layer even when the ferromagnetic layer is not under ferromagnetic coupling. According to this report, one of two layers sandwiching the nonmagnetic layer is fixed in magnetization beforehand by application of an exchanging bias magnetic field thereto, and the other ferromagnetic layer is magnetically reversed with an external magnetic field (signal magnetic field, for example). It results in changing the relative angle between the magnetization directions of these two ferromagnetic layers on opposite surfaces of the nonmagnetic layer, and exerting a large magnetoresistance effect. The multi-layered structure of this kind is often called "spin valve" (see Phys. Rev. B, Vol. 45, p806 (1992), J. Appl. Phys., Vol. 69, p 4774 (1981) and others).

Spin valves that can be magnetically saturated under a low magnetic field are suitable as MR heads and are already brought into practical use. However, their magnetoresistance ratios are only 20% maximum. Therefore, to cope with area recording densities not lower than 100 Gbpsi (gigabits per square inch), there is the need of a magnetoresistance effect element having a higher magnetoresistance ratio.

Structures of magnetoresistance effect elements are classified into CIP (current-in-plane) type structures permitting a sense current to flow in parallel to the film plane of the element and CPP (current-perpendicular-to-plane) type structures permitting a sense current to flow perpendicularly to the film plane of the element. Considering that CPP type magnetoresistance effect elements were reported to exhibit magnetoresistance ratios as large as approximately ten times those of CIP type elements (J. Phys. Condens. Mater., Vol. 11, p. 5717 (1999) and others), realization of the magnetoresistance raio of 100% is not impossible.

However, CPP type elements having been heretofore reported mainly use artificial lattices, and a large total thickness of films and a large number of boundary faces caused a large variation of resistance (absolute output value). To realize a satisfactory magnetic property required for a head, the use of a spin valve structure is desirable.

FIG. 30 is a cross-sectional view that schematically showing a CPP type magnetoresistance effect element having a spin valve structure. A magnetoresistance effect film M is interposed between an upper electrode 52 and a lower electrode 54, and a sense current flows perpendicularly to the film plane. The magnetoresistance effect film M shown here has the basic film structure sequentially made by depositing a base layer 12, antiferromagnetic layer 14, magnetization-pinned layer 16, nonmagnetic intermediate layer 18, magnetization free layer 20 and protective layer 22 on the lower electrode 54.

As these layers are basically made of metals. The magnetization-pinned layer (called pinned layer) is a magnetic layer in which magnetization is fixed substantially in one direction. The magnetization free layer 20 (called free layer) is a magnetic layer in which the direction of magnetization can freely change depending upon an external magnetic field.

This kind of spin valve structure, however, has a smaller total thickness and fewer boundary faces than those of artificial lattices. Therefore, if a current is supplied perpendicularly to the film plane, then the resistance becomes small and the absolute output value becomes smaller.

For example, if a spin valve film having a film structure heretofore used in a CIP structure is directly used in a CPP structure and a current is supplied perpendicularly of the film plane, the absolute value of the output per 1 $\mu m^2$, $A\Delta R$, is only about 1 $m\Omega \mu m^2$. That is, for practically using a CPP using a spin valve film, increase of the output is an important issue. For this purpose, it is very effective to increase the resistance value of a portion of the magnetoresistance effect element taking part in spin-dependent conduction and thereby increase the resistance change.

SUMMARY OF THE INVENTION

Output of a CPP type magnetoresistance effect element is determined by spin-dependent scattering along the interface between a magnetic layer and a nonmagnetic layer (interface scattering) and spin-dependent scattering in the magnetic layer (bulk scattering). Taking it into account, a large output increase can be expected by using a material exhibiting large spin-dependent interface scattering to form the interface with the nonmagnetic layer and using a material exhibiting large spin-dependent bulk scattering to form the substantial part occupying the majority part of the magnetic layer.

If a nonmagnetic back layer is inserted along one of interfaces of the magnetically pinned layer or magnetically free layer not contacting the nonmagnetic intermediate layer, spin-dependent interface scattering along the interface between the pinned layer and the nonmagnetic back layer or the interface between the free layer and the nonmagnetic back layer can be used. Thus, if a material exhibiting large spin-dependent interface scattering is used to form the interface between the pinned layer and the nonmagnetic back layer or between the free layer and the nonmagnetic back layer, the output increases.

Insertion of a different material in a location within the pinned layer or the free layer results in bringing a modulation in the band structure, and it may possibly increase the output.

The Inventors proceeded with their own trial and researches from that point of view, and reached the invention of the unique magnetoresistance effect element explained below.

According to the embodiment of the invention, there is provided a magnetoresistance effect element comprising:

a magnetoresistance effect film including a magnetically pinned layer having a magnetic material film whose direction of magnetization is pinned substantially in one direction, a magnetically free layer having a magnetic material film whose direction of magnetization changes in response to an external magnetic field, and a nonmagnetic metal intermediate layer located between said pinned layer and said free layer; and a pair of electrodes electrically connected to said magnetoresistance effect film to supply a sense current perpendicularly to a film plane of said magnetoresistance effect film, at least one of said pinned layer and said free layer including a thin-film insertion layer.

The thin-film insertion layer may be made of an alloy containing at least two kinds of metals among iron (Fe), cobalt (Co) and nickel (Ni) as matrix elements thereof, and in case of a binary alloy, said alloy containing each of said two kinds of matrix elements by not less than 25 atomic % respectively, and in case of a ternary alloy, said alloy containing each of said three kinds of matrix elements by not less than 5 atomic % respectively.

The thin-film insertion layer may alternatively be made of a binary alloy or a ternary alloy containing at least two kinds of metals among iron (Fe), cobalt (Co) and nickel (Ni) as matrix elements thereof, and additionally containing a quantity of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) not less than 0.1 atomic % and not exceeding 30 atomic %.

The thin-film insertion layer may alternatively be a binary alloy containing a quantity of iron (Fe) not less than 50 atomic % as the major component thereof, or a ternary alloy containing a quantity of iron (Fe) not less than 25 atomic % as the major component thereof, and said alloy having a body-centered cubic crystal structure.

The thin-film insertion layer may alternatively be made of iron (Fe) having a body-centered cubic crystal structure.

The thin-film insertion layer may alternatively be made of an alloy containing iron (Fe) and chromium (Cr) as major components thereof and adjusted in quantity of chromium (Cr) in the range from 0 atomic % to 80 atomic %, said alloy having a body-centered cubic crystal structure.

The thin-film insertion layer may alternatively be made of an alloy containing iron (Fe) and vanadium (V) as major components thereof and adjusted in quantity of vanadium (V) in the range from 0 atomic % to 70 atomic %, said alloy having a body-centered cubic crystal structure.

The thin-film insertion layer may alternatively be made of iron (Fe), or a binary or ternary alloy of iron (Fe), cobalt (Co) and nickel (Ni) containing a quantity of iron (Fe) not less than 50 atomic % in case of said binary alloy or 25% atomic % in case of said ternary alloy, and additionally containing a quantity of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) not less than 0.1 atomic % and not exceeding 30 atomic %.

The thin-film insertion layer may alternatively be made of cobalt (Co), or a binary or ternary alloy of iron (Fe), cobalt (Co) and nickel (Ni) containing a quantity of cobalt (Co) not less than 50 atomic % in case of said binary alloy or 25% atomic % in case of said ternary alloy, and additionally containing a quantity of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) not less than 0.1 atomic % and not exceeding 30 atomic %.

The thin-film insertion layer may alternatively be made of nickel (Ni), or a binary or ternary alloy of iron (Fe), cobalt (Co) and nickel (Ni) containing a quantity of nickel (Ni) not less than 50 atomic % in case of said binary alloy or 25% atomic % in case of said ternary alloy, and additionally containing a quantity of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) not less than 0.1 atomic % and not exceeding 30 atomic %.

The thin-film insertion layer may alternatively be made of a iron (Fe)-cobalt (Co)-system alloy having a body-centered cubic crystal structure, and additionally containing a quantity of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) not less than 0.1 atomic % and not exceeding 10 atomic %.

The thin-film insertion layer may alternatively be made of a iron (Fe)-cobalt (Co)-system alloy having a body-centered cubic crystal structure, and layers made of at least one kind of element selected from the group consisting of chromium (Cr), vanadium (V), tantalum (Ta), niobium (Nb), scandium (Sc), titanium (Ti), manganese (Mn), copper (Cu), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F) having a thickness not thinner than 0.03 nm and not exceeding 1 nm which permits said layers to exist as a body-centered cubic structure being periodically inserted in said alloy.

The nonmagnetic metal intermediate layer may have a resistance adjusting layer including at least one of oxides, nitrides and fluorides, and the thin-film insertion layer may include at least one element selected from the group consisting of iron (Fe), cobalt (Co) and nickel (Ni).

At least one of the pinned layer and said free layer may have a resistance adjusting layer including at least one of oxides, nitrides and fluorides, and the thin-film insertion layer may include at least one element selected from the group consisting of iron (Fe), cobalt (Co) and nickel (Ni).

A magnetic head according to the embodiment of the invention may comprise a magnetoresistance effect element having any one of the above-mentioned features.

A magnetic reproducing apparatus which reads information magnetically recorded in a magnetic recording medium according to the embodiment of the invention may comprise a magnetoresistance effect element having any one of the above-mentioned features.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Some embodiments of the invention will be explained below with reference to the drawings.

Figure 1:
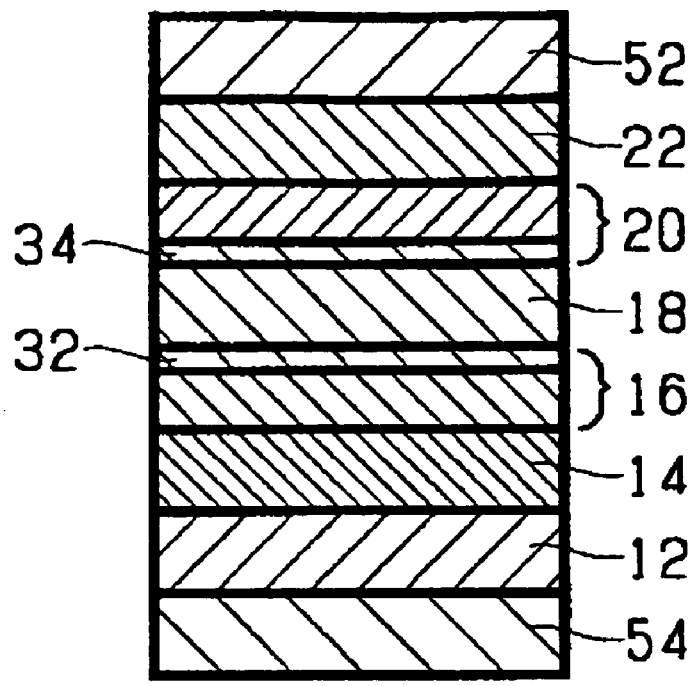
FIG. 1 is a diagram that schematically illustrates a cross-sectional structure of the substantial part of the magnetoresistance effect element according to an embodiment of the invention.

FIG. 1 is a diagram that schematically illustrates a cross-sectional structure of the substantial part of the magnetoresistance effect element according to an embodiment of the invention. The magnetoresistance effect element shown here has a structure including a base layer 12, anti-ferromagnetic layer 14, magnetically pinned layer 16, nonmagnetic intermediate layer 18, magnetically free layer 20, protective layer 22 and upper electrode 52 that are sequentially deposited in this order on a lower electrode 54. That is, the magnetoresistance effect film is sandwiched between the upper electrode 52 and the lower electrode 54, and the sense current flows perpendicularly to the film plane.

It is the portion of the pinned layer 16/nonmagnetic intermediate layer 18/free layer 20 that works for the magnetoresistance effect in the illustrated magnetoresistance effect element.

More specifically, in that portion, a resistance depending upon spins is generated against spin-polarized electrons, and the spin-dependent resistance is generated. According to the embodiment of the invention, as explained in greater detail, by inserting thin-film insertion layers 32 and 34 of unique materials in the pinned layer 16 and the free layer 20 and thereby enhancing the output of the element, i.e. the absolute value of the magnetoresistance change, it is possible to realize a CPP type magnetoresistance effect element acceptable for practical use.

That is, output of a CPP element is determined by spin-dependent scattering along the interface between a magnetic layer and a nonmagnetic layer (interface scattering) and spin-dependent scattering in the magnetic layer (bulk scattering). Thus a large output increase can be expected by using a material exhibiting large spin-dependent interface scattering to form the interface with the nonmagnetic layer and using a material exhibiting large spin-dependent bulk scattering to form the substantial part occupying the majority part of the magnetic layer.

Through their own trials and reviews, the Inventors have got the knowledge that a thin-film insertion layer of a unique material inserted as a part of the pinned layer 16 and/or free layer 20 contributes to promoting those spin-dependent scatterings and to increasing the magnetoresistance change.

While postponing explanation of the thin-film insertion layers particularly employed in the embodiment of the invention for later detailed explanation in conjunction with examples, here is made an explanation about other components forming the magnetoresistance effect element according to the embodiment.

The base layer 12 is preferably made of a material functioning to improve crystalline properties of the overlying free layer 20 and pinned layer 16 and to enhance the smoothness of the interfaces. A material having this kind of nature is, for example, an alloy of Ni (nickel), Fe (iron) and Cr (chromium) containing approximately 40% of Cr. Although not shown, for higher-quality alignment, a layer made of NiFe, Ru (ruthenium), Cu (copper), etc. for example, may be inserted between the base layer 12 and the anti-ferromagnetic layer 14.

The anti-ferromagnetic layer 14 has the role of pinning magnetization of the pinned layer 16. That is, by locating the anti-ferromagnetic layer 14 of PtMn (platinum manganese), IrMn (iridium manganese), PdPtMn (palladium platinum manganese) or NiMn, for example, next to the pinned layer 16, magnetization of the pinned layer 16 can be pinned in one direction by making use of an exchanging coupling bias magnetic field generated along the interface.

To enhance the magnetically pinning effect of the pinned layer 16, a magnetic coupling intermediate layer (not shown) is preferably inserted between the anti-ferromagnetic layer 14 and the pinned layer 16. Material of the magnetic coupling intermediate layer may be a ferromagnetic alloy containing Fe, Co (cobalt) or Ni, for example, as its major component. Thickness thereof should be as thin as 0.1 through 3 nm to control magnetization of the pinned layer 16.

As the magnetic coupling intermediate layer, a so-called synthetic type multi-layered structure made of a multi-layered ferri-type film of a ferromagnetic layer/anti-parallel coupling layer/ferromagnetic layer employed in spin-valve GMR is also preferable for controlling pinning magnetization.

The nonmagnetic intermediate layer 18 has the role of interrupting magnetic coupling between the pinned layer 16 and the free layer 20. Further, the nonmagnetic intermediate layer 18 preferably functions to form a high-quality interface between the nonmagnetic intermediate layer 18 and the pinned layer 16 (thin-film insertion layer 32) such that up-spin electrons flowing from the pinned layer 16 to the free layer 20 are not scattered.

Material of the nonmagnetic intermediate layer 18 may be, for example, Cu (copper), Au (gold), Ag (silver), Ru (ruthenium), Ir (iridium), Pd (palladium), Cr (chromium), Mg (magnesium), Al (aluminum), Rh (rhodium) or Pt (platinum). Thickness thereof should be thick enough to sufficiently interrupt magnetic coupling between the free layer 20 and the pinned layer 16 and thin enough to prevent scattering of up-spin electrons from the pinned layer 16. Preferably, the thickness is in the range from 0.5 to 5 nm, approximately, although it depends on the material used.

The protective layer 22 has the role of protect the multi-layered structure of the magnetoresistance effect film during patterning and/or other processing.

In the CPP magnetoresistance effect element having those components, the magnetoresistance change can be increased by inserting the thin-film insertion layer 32 as a part of the pinned layer 16 and the thin-film insertion layer 34 as a part of the free layer 20 as shown in FIG. 1.

Before explaining specific configuration of the thin-film insertion layers 32, 34, other specific examples of magnetoresistance effect elements employable in the embodiment of the invention are explained below.

FIGS. 2 through 5 are diagrams that schematically illustrate those other specific examples of magnetoresistance effect elements according to the embodiment of the invention. In these drawings, the same or equivalent components to those shown in FIG. 1 are labeled with common reference numerals, and their detailed explanation is omitted.

Figure 2:
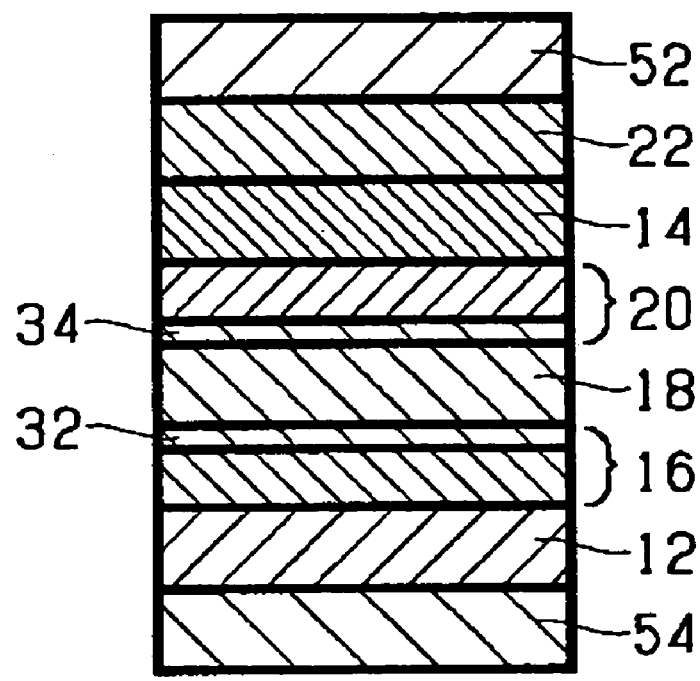
FIG. 2 is a diagram that schematically illustrates the second specific example of the magnetoresistance effect element according to an embodiment of the invention.

The magnetoresistance effect element shown in FIG. 2 is a modification in the stacking order from the element of FIG. 1. Also in this element, by inserting the thin-film insertion layer 32 as the interface between the pinned layer 16 and the nonmagnetic intermediate layer 18 and inserting the thin-film insertion layer 34 as the interface between the free layer 20 and the nonmagnetic intermediate layer 18, the same effects as those already explained in conjunction with FIG. 1 can be obtained.

Figure 3:
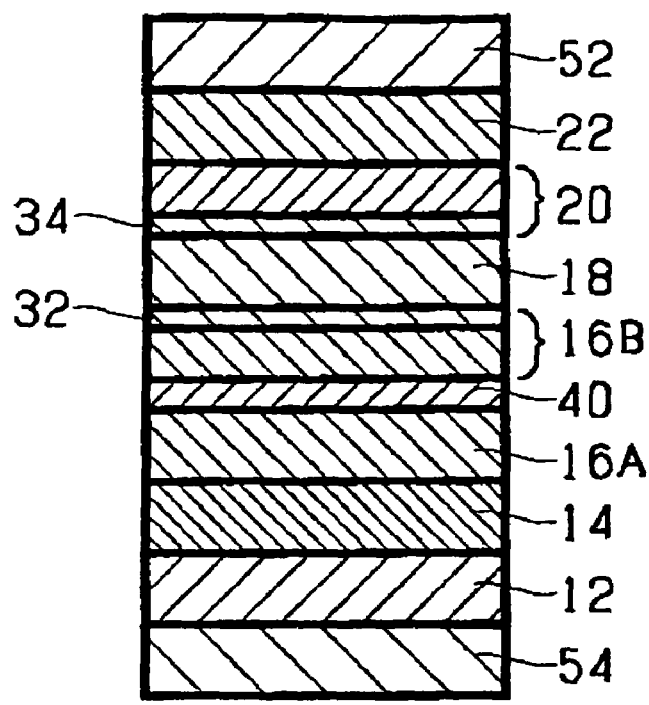
FIG. 3 is a diagram that schematically illustrates the third specific example of the magnetoresistance effect element according to an embodiment of the invention.

In case of the magnetoresistance effect element shown in FIG. 3, by dividing the pinned layer by an anti-ferromagnetic coupling layer 40 and pinning the directions of magnetization in the first pinned layer 16A and the second pinned layer 16B, thereby to reduce magnetization of the whole pinned layer, the magnetically pinning force by the anti-ferromagnetic layer 14 can be increased.

Also in the element shown in FIG. 3, by inserting the thin-film insertion layers 32, 34 in the pinned layer 16 and the free layer 20, respectively, the above-explained spin-scattering effect is obtained.

Figure 4:
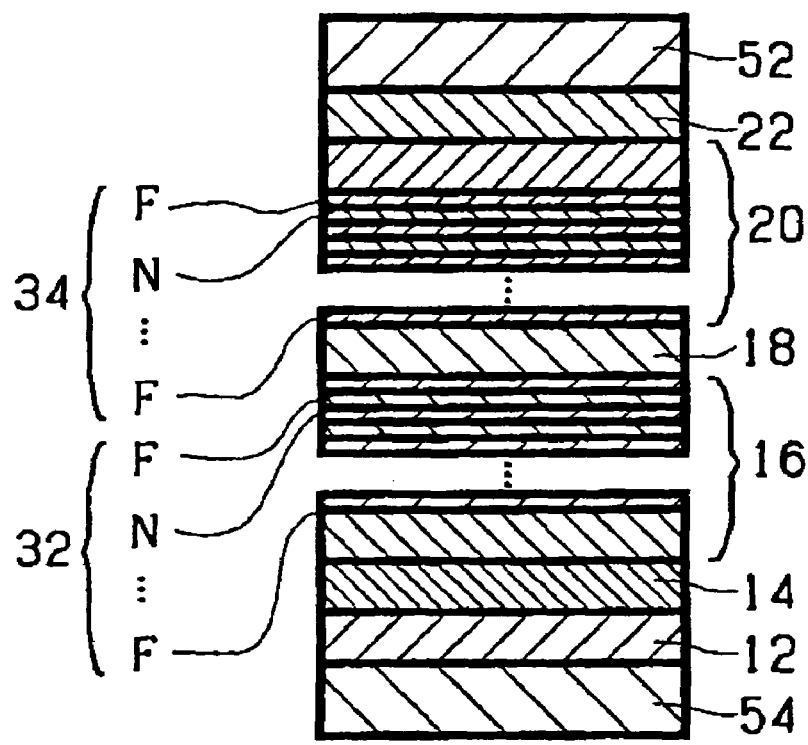
FIG. 4 is a diagram that schematically illustrates the fourth specific example of the magnetoresistance effect element according to an embodiment of the invention.

In case of the magnetoresistance effect element shown in FIG. 4, each of the thin-film insertion layers 32, 34 has a multi-layered structure alternately depositing ferromagnetic layers F and nonmagnetic layers N.

Figure 5:
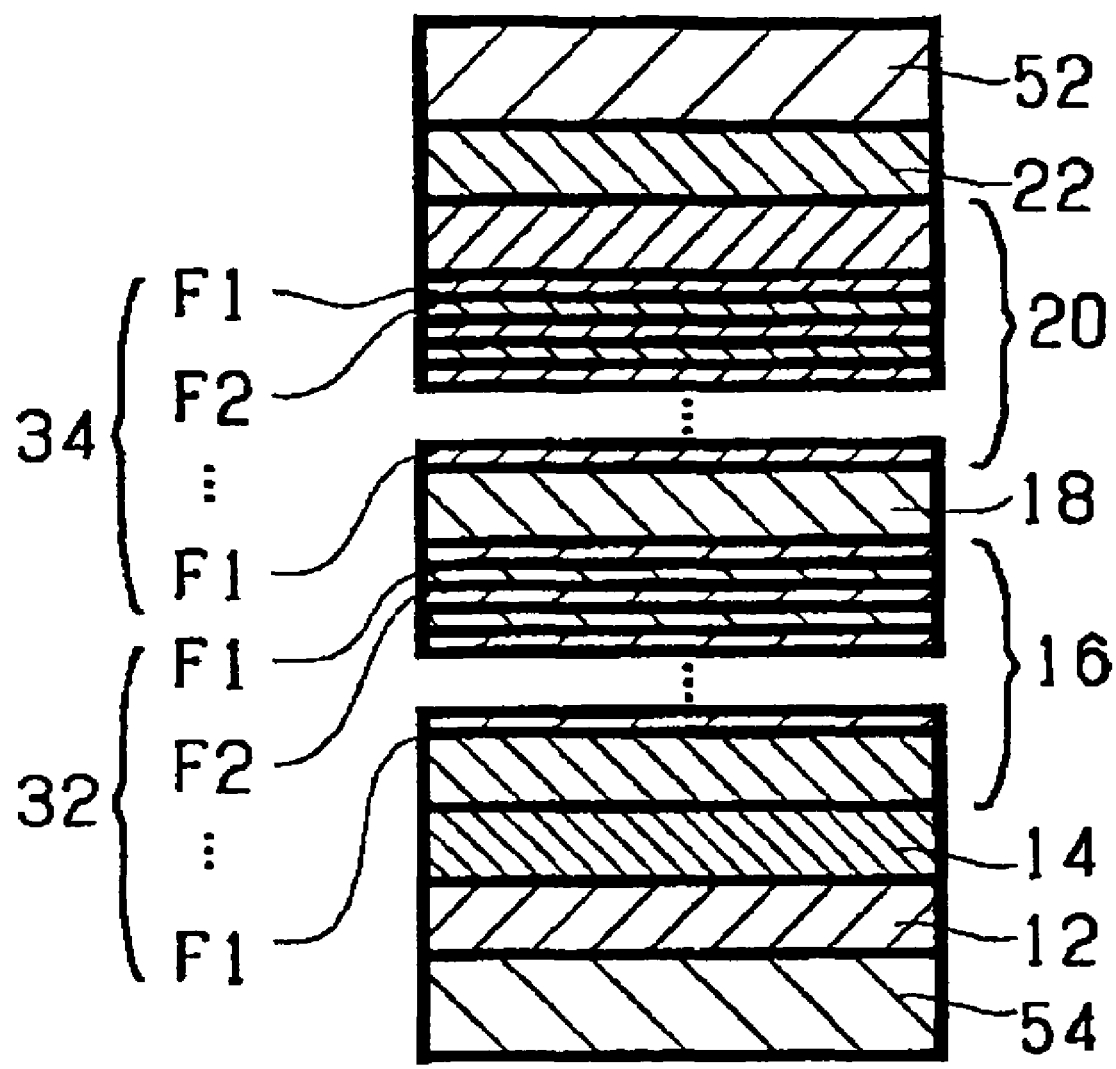
FIG. 5 is a diagram that schematically illustrates the fifth specific example of the magnetoresistance effect element according to an embodiment of the invention.

On the other hand, in case of the magnetoresistance effect element show in FIG. 5, each of the thin-film insertion layers 32, 34 has a multi-layered structure alternately depositing two different kinds of ferromagnetic layers F1, F2.

Effects of the embodiment of the invention were confirmed by way of the following two elements.

Figure 28:
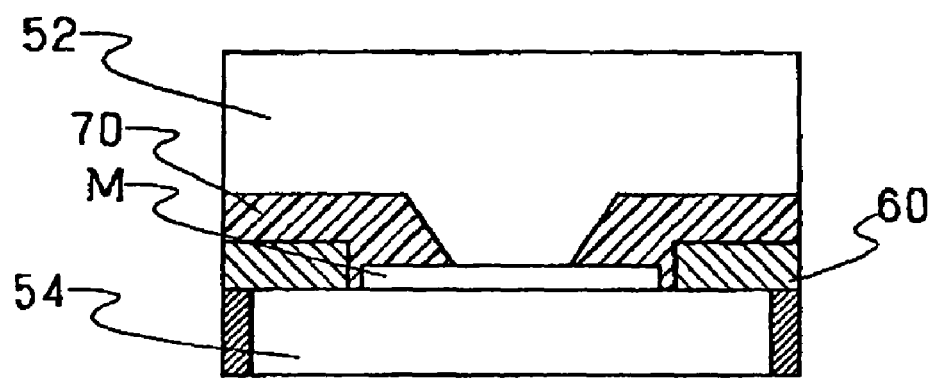
FIG. 28 is a diagram that schematically shows a CPP element structure experimentally prepared according to an embodiment of the invention.

One of them has a CPP element structure as shown in FIG. 28. Structure of this element is explained below, following to its manufacturing process.

First, $AlO_x$ is deposited on a Si (silicon) substrate (not shown) to form a 500 nm thick layer, and a resist is once coated thereon and selectively removed from the region for the lower electrode 54 by PEP (photoengraving process).

After that, $AlO_x$ is selectively removed from the region not coated by the resist by RIE (reactive ion etching), and the lower electrode is formed as a Ta (5 nm)/Cu (400 nm)/Ta (20 nm) film. Numerals in the parentheses indicate thicknesses (also in the description to follow).

Thereafter, CMP (chemical mechanical polishing) is carrier out to expose $AlO_x$ in the region other than the region for the lower electrode. On such a structure, a magnetoresistance effect film M sized 3×3 μm² through 5×51 m² was formed. In some elements, a hard film 60 of CoPt was formed on the side surface of the magnetoresistance effect film up to 30 nm.

A 200 nm thick $SiO_x$ was formed as a passivation film 70, and a contact hole (0.3 μmφ+−3 mφ) was formed in a central position of the magnetoresistance effect film M by RIE and ion milling.

Subsequently, the upper electrode 52 (Ta(5 nm)/Cu (400 nm)/Ta (5 nm)) and an electrode pad (Au (200 nm)) were formed.

Figure 29:
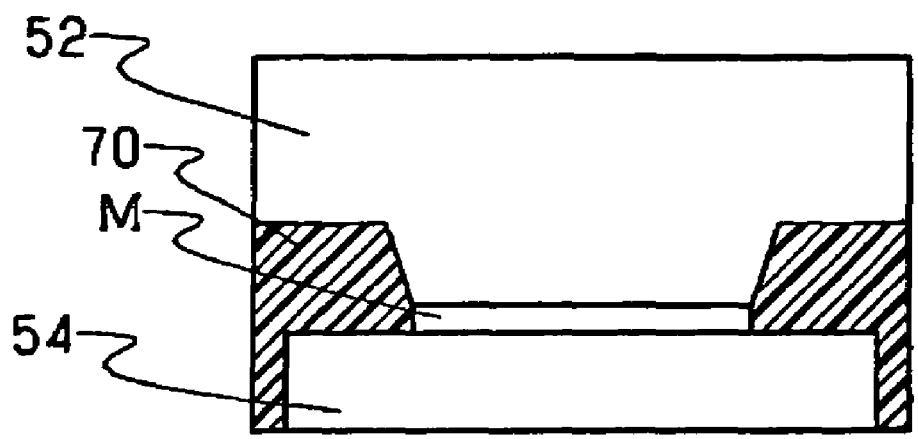
FIG. 29 is a diagram that schematically shows another CPP element structure experimentally prepared according to an embodiment of the invention.
Figure 30:
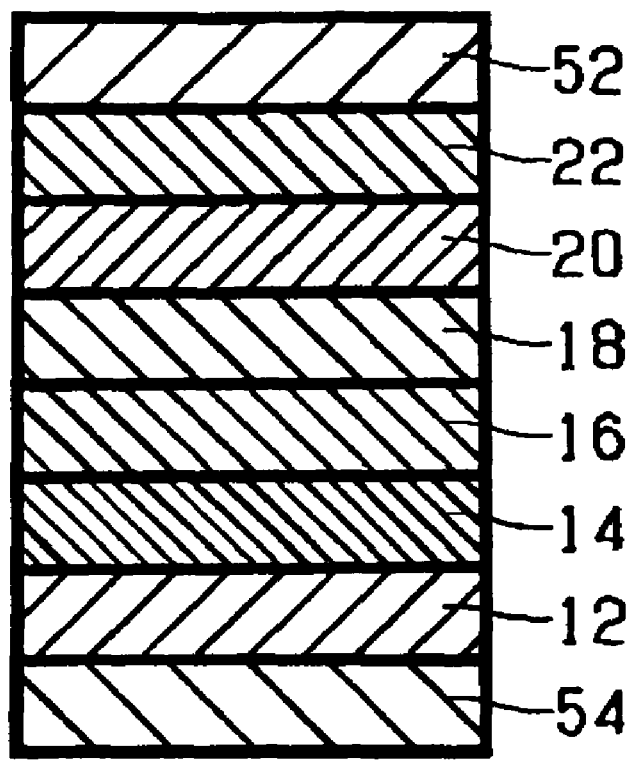
FIG. 30 is a cross-sectional view that schematically shows a CPP type magnetoresistance effect element having a spin valve structure.

The other of those two elements has a structure as shown in FIG. 29. The same process was used up to deposition of the lower electrode 54 and CMP. Thereafter, the magnetoresistance effect film M was formed on the structure, and the lengthwise direction was regulated from 2 μm to 5 μm.

Then, $SiO_x$ to be used as the passivation film 70 was deposited up to 200 nm, and the size was regulated from 1.5 μm to 5 μm in the direction angled by 90 degrees from the lengthwise direction. In this case, a 100 nm thick Au film was formed just above the magnetoresistance effect film M to ensure a uniform flow of the sense current throughout the magnetoresistance effect film M, and the upper electrode 52 and the electrode pad were formed thereafter in the same manner as the first element.

With these elements, their magnetoresistance properties were measured by the four-terminal method, and they were confirmed to be equivalent in output. Further, their crystalline structures were analyzed by using Cu—K α rays, their morphologies were confirmed by cross-sectional TEM (transmission electron microscopy), and their composition profiles were reviewed by n-EDX (energy dispersive X-ray spectroscopy). Additionally, EXAFS (extended X-ray absorption fine structure) electron states were investigated for specific elements in the alloys.

Explained below is a result of investigation about appropriate thicknesses of the thin-film insertion layers 32, 34 to be inserted between the pinned layer 16 or the free layer 20 and the nonmagnetic intermediate layer 18 in the first to fourth examples of the invention.

FIRST EXAMPLE

In the structure shown in FIG. 1, a magnetoresistance effect film including the free layer 20 and the pinned layer 16 each being an alloy layer of a $Ni_{80}Fe_{20}$ layer and a $C_{50}Fe_{50}$ thin-film insertion layer was formed. The film configuration is as follows.

| Protective layer 22: | Ta | (10 nm) |
| Part of the free layer 20: | $Ni_{80}Fe_{20}$ | (5-x nm) |
| Thin-film insertion layer 34: | $Co_{50}Fe_{50}$ | (x nm) |
| Nonmagnetic intermediate layer 18: | Cu | (3 nm) |
| Thin-film insertion layer 32: | $Co_{50}Fe_{50}$ | (x nm) |
| Part of the pinned layer 16: | $Ni_{80}Fe_{20}$ | (5-x nm) |
| Anti-ferromagnetic layer 14: | PtMn | (15 nm) |
| Second base layer 12: | NiFeCr | (5 nm) |
| First base layer 12: | Ta | (5 nm) |

A plurality of such elements were prepared by fixing the total thickness of the free layer 20 and the pinned layer 16 in 5 nm and changing the thickness x of the $Co_{50}Fe_{50}$ layer as the thin-film insertion layer from 0 nm to S nm in each prepared element. Additionally, thickness of the thin-film insertion layer 32 inserted in the pinned layer 16 and thickness of the thin-film insertion layer 34 inserted in the free layer 20 were equally x nm.

Figure 6:
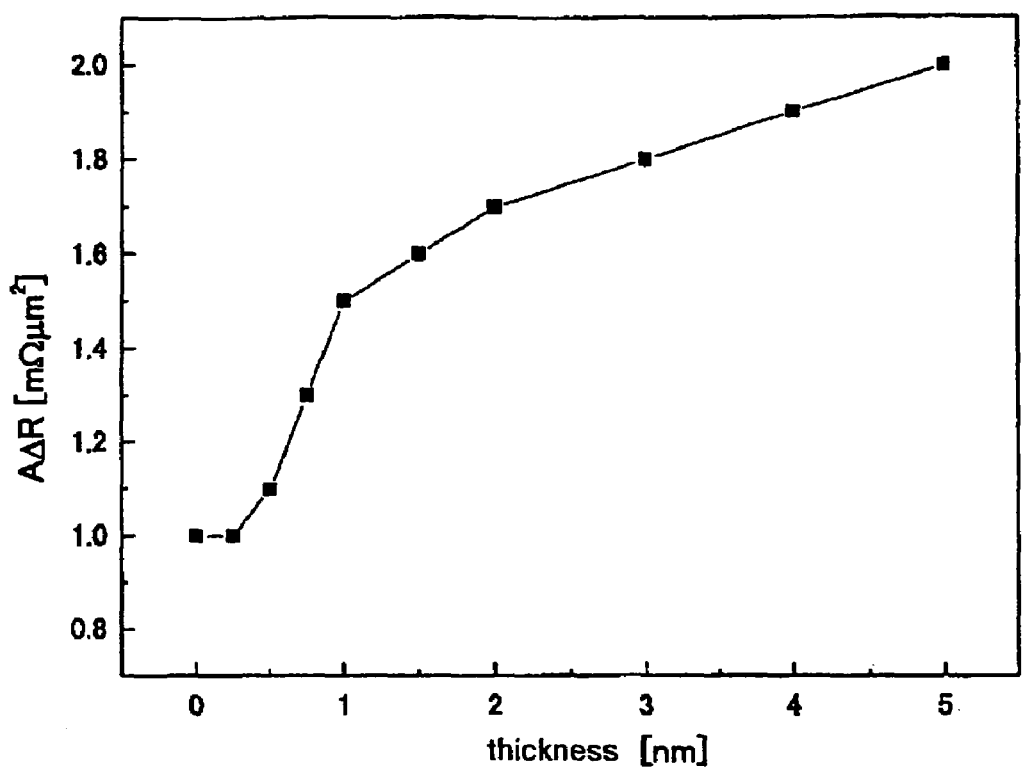
FIG. 6 is a graph diagram that shows dependency of the resistance change upon the thickness of a thin-film insertion layer $Co_{50}Fe_{50}$.

FIG. 6 is a graph diagram that shows dependency of the resistance change upon the thickness of a thin-film insertion layer $Co_{50}Fe_{50}$. The abscissa shows thickness of the thin-film insertion layer, and the ordinate shows the quantity of resistance change AΔR per unit area 1 μm² of the element.

It is appreciated from the graph that, when the thin-film insertion layer is thickened, AΔR begins to increase from near the thickness of 0.5 nm, then becomes approximately 1.4 times when the thickness is 1 nm, and even thereafter increases continuously. In case the thin-film insertion layer is excessively thin, it is presumed that the desired quality of the $Co_{50}Fe_{50}$ thin-film insertion layer will not be formed due to mixing (alloying) and the output will not increase. Therefore, in case an element of a clean film quality free from mixing, the thin-film insertion layer, even thinner, will be also effective.

It is presumed that the increase of AΔR obtained with such a small thickness of the thin-film insertion film is caused by an increase of the spin-dependent interface scattering. However, because $Co_{50}Fe_{50}$ is large also in spin-dependent bulk scattering, it is appreciated that the output further increases when its thickness increases.

Figure 7:
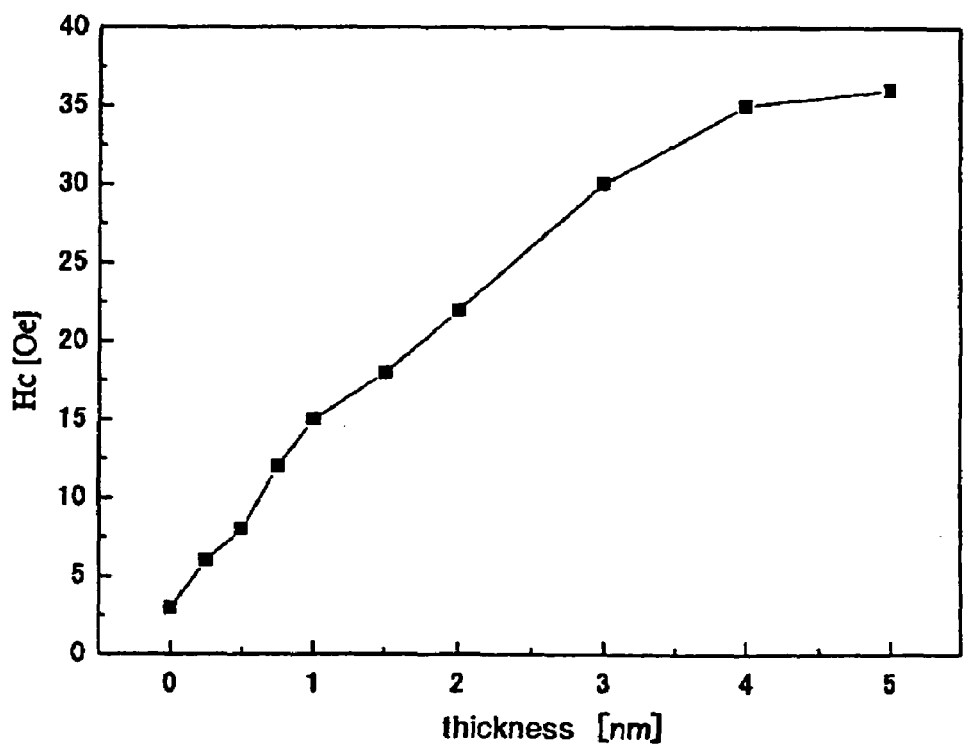
FIG. 7 is a graph diagram that shows dependency of the coercive force of the free layer upon thickness of the thin-film insertion layer.

FIG. 7 is a graph diagram that shows dependency of the coercive force of the free layer upon thickness of the thin-film insertion layer. The abscissa shows the thickness of the thin-film insertion layer, and the ordinate shows the coercive force Hc of the free layer.

It is appreciated from FIG. 7 that the coercive force Hc increases as the thin-film insertion layer if made thicker, and exceeds 15 Oe (oersteds) when it reaches 1 nm. When the coercive force of the free layer increases, the sensitivity to the external magnetic field degrades. Therefore, there is an upper limit for the thickness of the thin-film insertion layer.

Taking these factors into account, in case the free layer and the pinned layer are symmetrically formed, that is, in case the free layer 20 and the pinned layer-16 are alloy layers each made up of the $Ni_{80}Fe_{20}$ layer and the $Co_{50}Fe_{50}$ thin-film insertion layer, and thickness of the thin-film insertion layer is equal in both layers 20 and 16, practical thickness will be from 0.5 nm to 1 nm for both thin-film insertion layers 32, 34 from the viewpoint of increasing AΔR and controlling Hc.

SECOND EXAMPLE

As the second example of the embodiment of the invention, a magnetoresistance effect film including the free layer 20 and the pinned layer 16 each being an alloy layer of a $Ni_{80}Fe_{20}$ layer and a $Co_{50}Fe_{50}$ thin-film insertion layer was formed in the structure shown in FIG. 1. The film configuration is as follows.

| Protective layer 22: | Ta | (10 nm) |
| Part of the free layer 20: | $Co_{90}Fe_{10}$ | (5-x nm) |
| Thin-film insertion layer 34: | $Co_{50}Fe_{50}$ | (x nm) |
| Nonmagnetic intermediate layer 18: | Cu | (3 nm) |
| Thin-film insertion layer 32: | $Co_{50}Fe_{50}$ | (x nm) |
| Part of the pinned layer 16: | $Co_{90}Fe_{10}$ | (5-x nm) |
| Anti-ferromagnetic layer 14: | PtMn | (15 nm) |
| Second base layer 12: | NiFeCr | (5 nm) |
| First base layer 12: | Ta | (5 nm) |

Here again, a plurality of such elements were prepared by fixing the thickness of the free layer 20 and the pinned layer 16 in 5 nm and changing the thickness of the $Co_{50}Fe_{50}$ thin-film insertion layers 32, 34 from 0 nm to 5 nm in each prepared element.

Figure 8:
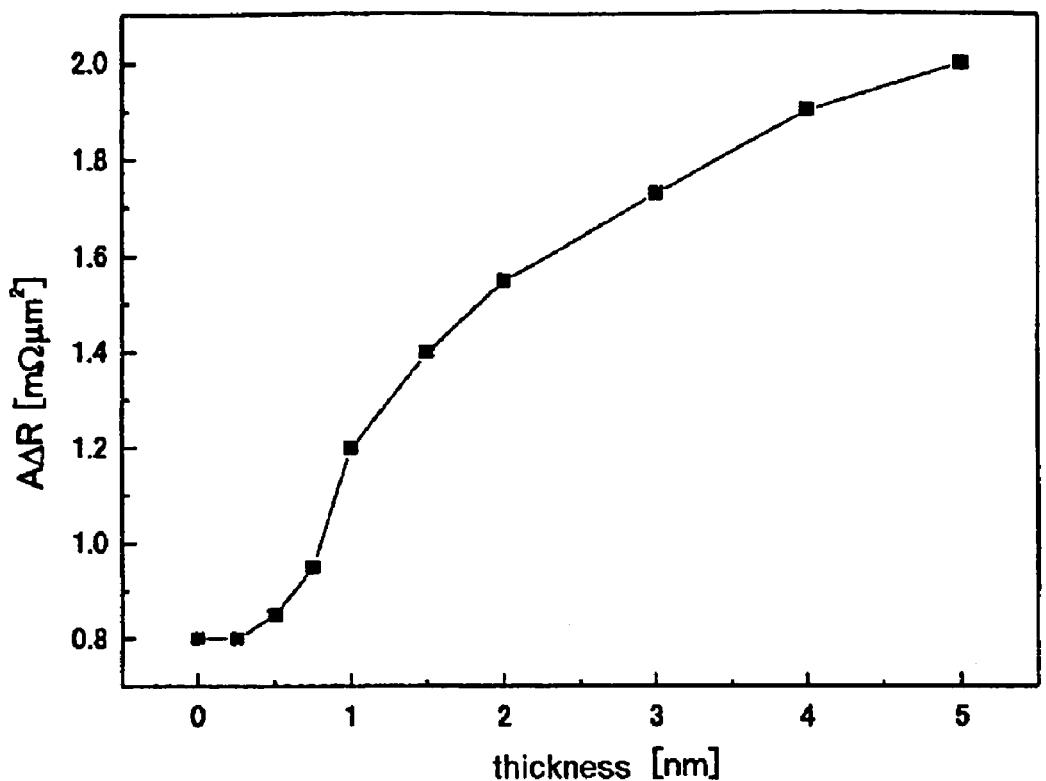
FIG. 8 is a graph diagram that shows dependency of the resistance change upon the thickness of the thin-film insertion layer $Co_{50}Fe_{50}$.

FIG. 8 is a graph diagram that shows dependency of the resistance change upon the thickness of the thin-film insertion layer $Co_{50}Fe_{50}$. The abscissa shows thickness of the thin-film insertion layer, and the ordinate shows the quantity of resistance change AΔR per unit area 1 μm² of the element.

It is appreciated from the graph that, when the thin-film insertion layer is thickened, AΔR begins to increase from the thickness of 0.5 nm, then becomes approximately 1.5 times when the thickness is 1 nm, and even thereafter increases continuously. Again, in case the thin-film insertion layer is excessively thin, it is presumed that the desired quality of the $Co_{50}Fe_{50}$ thin-film insertion layer will not be formed due to mixing (alloying) and the output will not increase. Therefore, in case an element of a clean film quality free from mixing, the thin-film insertion layer, even thinner, will be also effective.

It is presumed that the increase of AΔR obtained with such a small thickness of the thin-film insertion film is caused by an increase of the spin-dependent interface scattering. However, because $Co_{50}Fe_{50}$ is large also in spin-dependent bulk scattering, it is appreciated that the output further increases when its thickness increases.

Figure 9:
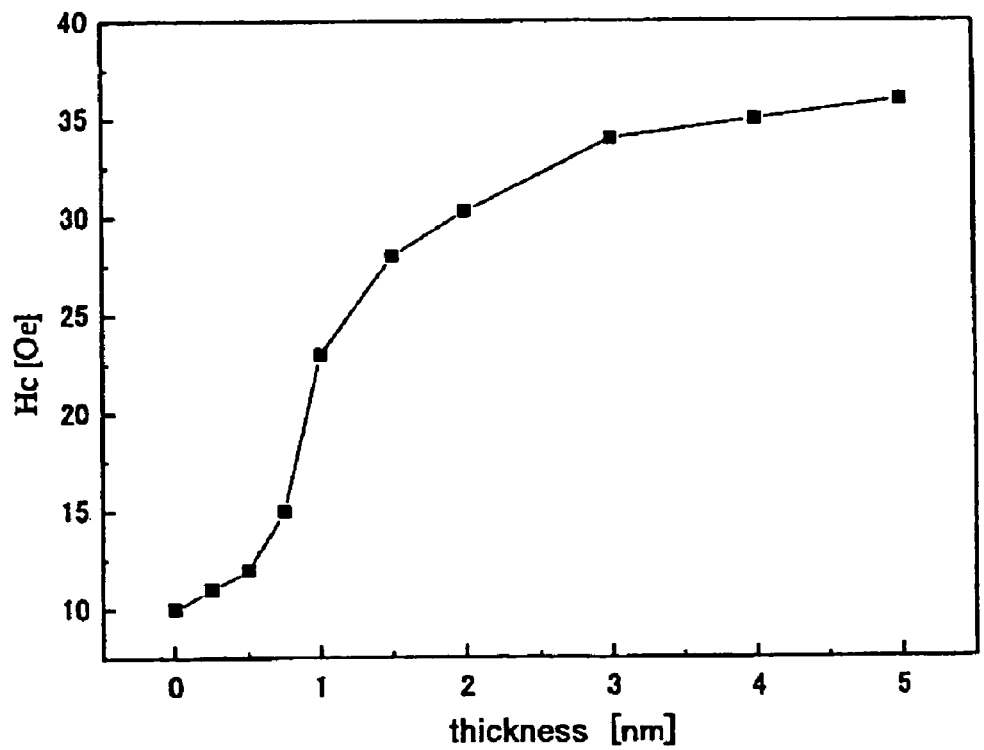
FIG. 9 is a graph diagram that shows dependency of the coercive force of the free layer upon thickness of the thin-film insertion layer.

FIG. 9 is a graph diagram that shows dependency of the coercive force of the free layer upon thickness of the thin-film insertion layer. The abscissa shows the thickness of the thin-film insertion layer, and the ordinate shows the coercive force Hc of the free layer.

It is appreciated from FIG. 9 that the coercive force Hc increases as the thin-film insertion layer if made thicker, and exceeds 15 Oe (oersteds) when it reaches 0.75 nm. When the coercive force of the free layer increases, the sensitivity to the external magnetic field degrades. Therefore, there is an upper limit for the thickness of the thin-film insertion layer.

Here again, taking these factors into account, in case the free layer and the pinned layer are symmetrically formed, that is, in case the free layer 20 and the pinned layer 16 are alloy layers each made up of the $Co_{90}Fe_{10}$ layer and the $Co_{50}Fe_{50}$ thin-film insertion layer, and thickness of the thin-film insertion layer is equal in both layers 20 and 16, practical thickness will be from 0.5 nm to 0.75 nm for both thin-film insertion layers 32, 34 from the viewpoint of increasing AΔR and controlling Hc.

THIRD EXAMPLE

As the third example of the embodiment of the invention, a magnetoresistance effect film was formed in which the free layer 20 is a 5 nm thick $Ni_{80}Fe_{20}$ layer without insertion of the thin-film insertion layer 34 and only the pinned layer 16 is made up of the $Ni_{80}Fe_{20}$ layer and the $Co_{50}Fe_{50}$ thin-film insertion layer in the structure shown in FIG. 1. The film configuration is as follows.

| Protective layer 22: | Ta | (10 nm) |
| Free layer 20: | $Ni_{80}Fe_{20}$ | (5 nm) |
| Nonmagnetic intermediate layer 18: | Cu | (3 nm) |
| Thin-film insertion layer 32: | $Co_{50}Fe_{50}$ | (x nm) |
| Part of the pinned layer 16: | $Ni_{80}Fe_{20}$ | (5-x nm) |
| Anti-ferromagnetic layer 14: | PtMn | (15 nm) |
| Second base layer 12: | NiFeCr | (5 nm) |
| First base layer 12: | Ta | (5 nm) |

Here again, a plurality of such elements were prepared by fixing the thickness of the pinned layer 16 in 5 nm and changing the thickness of the $Co_{50}Fe_{50}$ thin-film insertion layer 32 from 0 nm to 5 nm in each prepared element.

Figure 10:
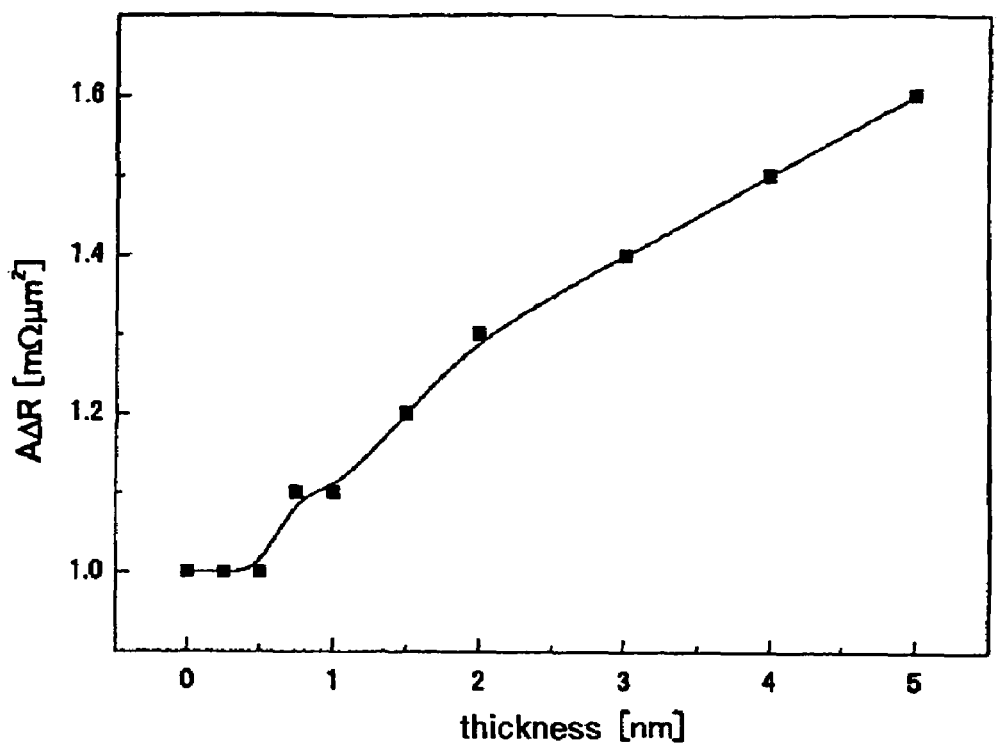
FIG. 10 is a graph diagram that shows dependency of the resistance change upon the thickness of the thin-film insertion layer $Co_{50}Fe_{50}$.

FIG. 10 is a graph diagram that shows dependency of the resistance change upon the thickness of the thin-film insertion layer $Co_5Fe_{50}$. The abscissa shows thickness of the thin-film insertion layer, and the ordinate shows the quantity of resistance change AΔR per unit area 1 μm² of the element.

It is appreciated from the graph that, when the thin-film insertion layer is thickened, AΔR begins to increase from the thickness of 0.75 nm and becomes approximately 1.6 times when the thickness reaches 5 nm to fully replace the pinned layer 16. Here again, in case the thin-film insertion layer is excessively thin, it is presumed that the desired quality of the $Co_{50}Fe_{50}$ thin-film insertion layer will not be formed due to mixing (alloying) and the output will not increase. Therefore, in case an element of a clean film quality free from mixing, the thin-film insertion layer, even thinner, will be also effective.

It is presumed that the increase of AΔR obtained with such a small thickness of the thin-film insertion film is caused by an increase of the spin-dependent interface scattering. However, because $Co_{50}Fe_{50}$ is large also in spin-dependent bulk scattering, it is appreciated that the output further increases when its thickness increases.

Figure 11:
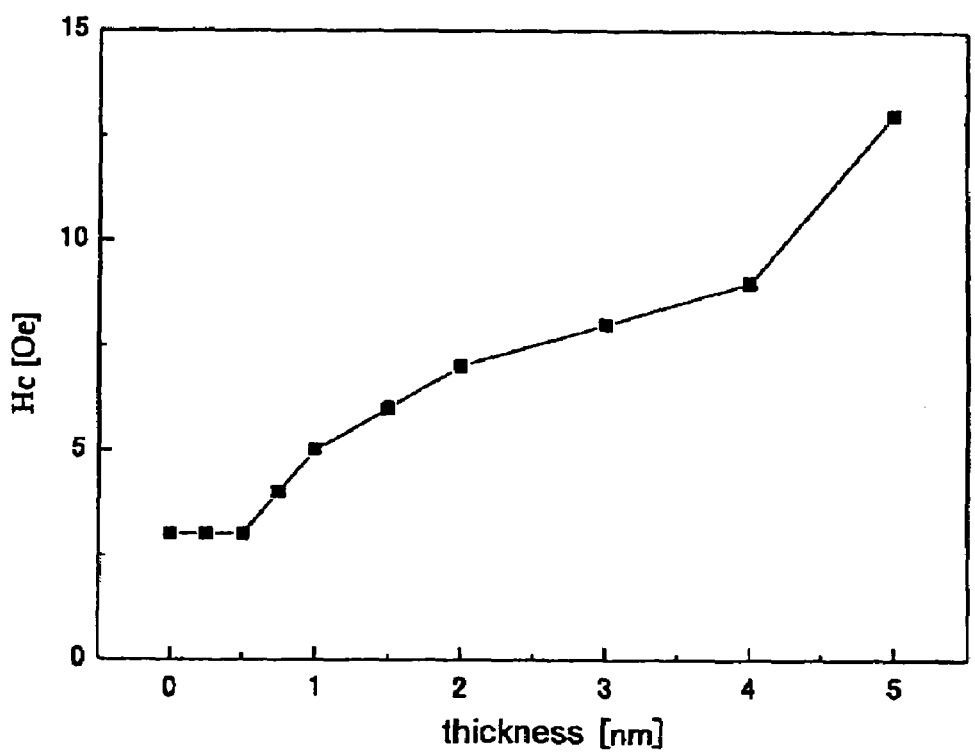
FIG. 11 is a graph diagram that shows dependency of the coercive force of the free layer upon thickness of the thin-film insertion layer.

FIG. 11 is a graph diagram that shows dependency of the coercive force of the free layer upon thickness of the thin-film insertion layer. The abscissa shows the thickness of the thin-film insertion layer, and the ordinate shows the coercive force Hc of the free layer.

When the thin-film insertion layer is inserted only in the pinned layer 16, Hc is suppressed as compared with the structure the thin-film insertion layer is inserted in both the pinned layer and the free layer. However, when its thickness reaches 5 nm where the spin valve film entirely begins to deteriorate in crystalline property, Hc undesirably exceeds 10 Oe.

Therefore, in case the thin-film insertion layer 32 made of $Co_{50}Fe_{50}$ is inserted only in the pinned layer, it will be practical to limit the thickness of the thin-film insertion layer 32 in the range not thinner than 0.75 nm and not thicker than 4 nm from the viewpoint of increasing AΔR and controlling Hc.

FOURTH EXAMPLE

As the fourth example of the embodiment of the invention, a magnetoresistance effect film was formed in which the pinned layer 16 has the fixed structure of $Ni_{80}Fe_{50}$ (3 nm)/$Co_{50}Fe_{50}$ (3 nm) while the free layer 20 is made up of a $Ni_{80}Fe_{20}$ layer and a $Co_{90}Fe_{10}$ thin-film insertion layer 20 inserted therein in the structure shown in FIG. 1. The film configuration is as follows.

| Protective layer 22: | Ta | (10 nm) |
| Part of the free layer 20: | $Ni_{80}Fe_{20}$ | (5-x nm) |
| Thin-film insertion layer 34: | $Co_{90}Fe_{10}$ | (x nm) |
| Nonmagnetic intermediate layer 18: | Cu | (3 nm) |
| Pinned layer 16: | $Co_{50}Fe_{50}$ | (3 nm) |
| Pinned layer 16: | $Ni_{80}Fe_{20}$ | (2 nm) |
| Anti-ferromagnetic layer 14: | PtMn | (15 nm) |
| Second base layer 12: | NiFeCr | (5 nm) |
| First base layer 12: | Ta | (5 nm) |

In this example, a plurality of elements were prepared by fixing the total thickness of the free layer 20 in 5 nm and changing the thickness of the $Co_{90}Fe_{10}$ thin-film insertion layer 34 from 0 nm to 5 nm in each prepared element.

Figure 12:
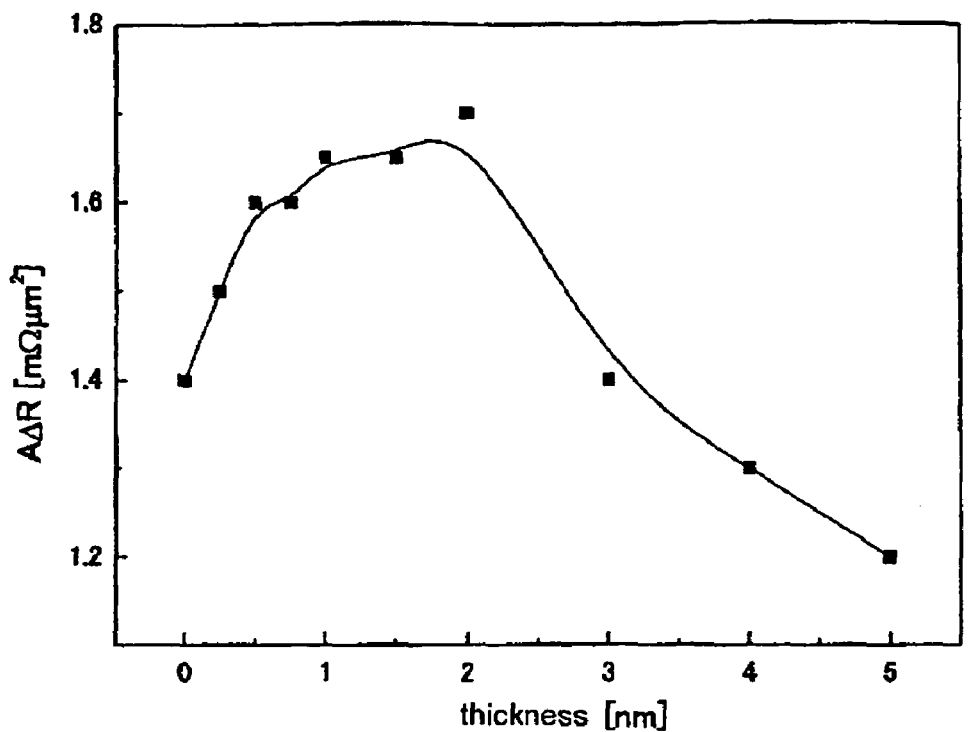
FIG. 12 is a graph diagram that shows dependency of the resistance change upon the thickness of the thin-film insertion layer $Co_{50}Fe_{50}$.

FIG. 12 is a graph diagram that shows dependency of the resistance change upon the thickness of the thin-film insertion layer $Co_{90}Fe_{10}$. The abscissa shows thickness of the thin-film insertion layer, and the ordinate shows the quantity of resistance change AΔR per unit area 1 μm² of the element.

It is appreciated from the graph that, when the thin-film insertion layer is thickened, AΔR begins to increase from the thickness of 0.25 nm and reaches the maximum value when the thickness is 2 nm. Here again, in case the thin-film insertion layer is excessively thin, it is presumed that the desired quality of the $Co_{90}Fe_{10}$ thin-film insertion layer will not be formed due to mixing (alloying) and the output will not increase. Therefore, in case an element of a clean film quality free from mixing, the thin-film insertion layer, even thinner, will be also effective.

Although the $Co_{90}Fe_{10}$ thin-film is greatly effective for enhancing the spin-dependent interface scattering, $Ni_{80}Fe_{20}$ is superior in spin-dependent bulk scattering. Therefore, if the thin-film insertion layer 34 is thickened, the output tends to decrease.

Figure 13:
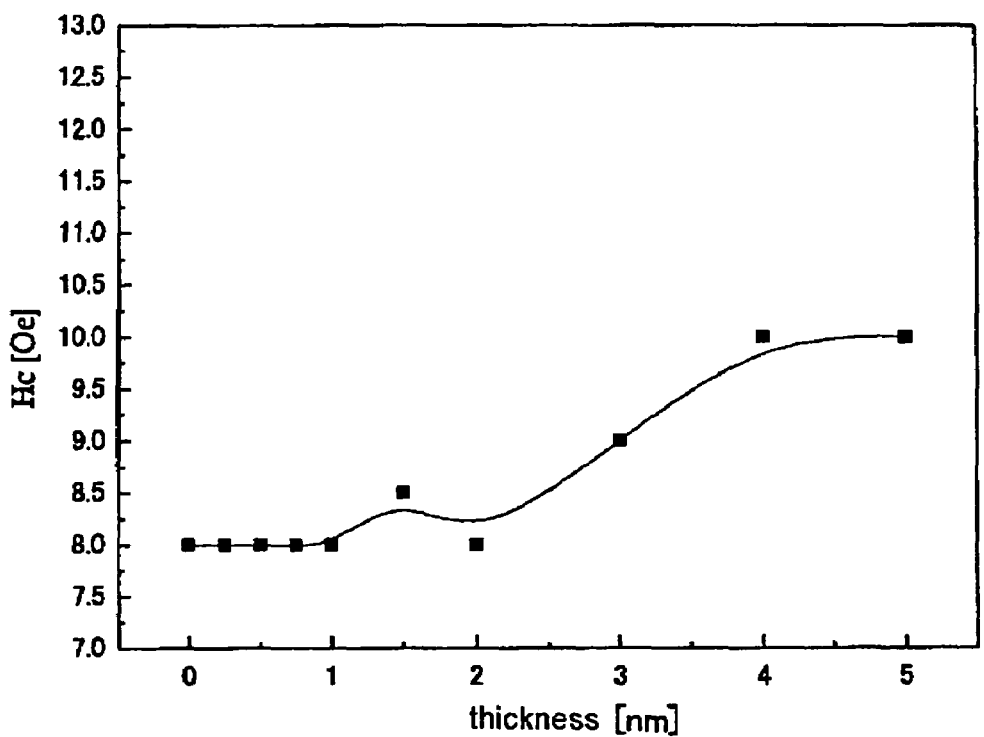
FIG. 13 is a graph diagram that shows dependency of the coercive force of the free layer upon thickness of the thin-film insertion layer.

FIG. 13 is a graph diagram that shows dependency of the coercive force of the free layer upon thickness of the thin-film insertion layer. The abscissa shows the thickness of the thin-film insertion layer, and the ordinate shows the coercive force Hc of the free layer.

As the thin-film insertion layer 34 becomes thicker, Hc increases. However, this tendency is moderate, and limited within 10 Oe as a whole.

Therefore, in case the pinned layer 16 is fixed as $Ni_{80}Fe_{20}$ (2 nm)/$Co_{50}Fe_{50}$ (3 nm) and the $Co_{90}Fe_{10}$ thin-film insertion layer is inserted in the free layer 20, it will be practical to limit the thickness of the thin-film insertion layer 34 in the range not smaller than 0.25 nm and smaller than 2.5 nm from the viewpoint of increasing AΔR and controlling Hc.

Hereafter, a result of investigation about appropriate materials of the thin-film insertion layers to be inserted in the pinned layer and the free layer 20 as the fifth to eleventh examples of the invention.

FIFTH EXAMPLE

As the fifth example, magnetoresistance effect elements shown in FIG. 1 were prepared. Their film configuration is as follows.

| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As the material X of the thin-film insertion layers 32, 34, five kinds of Fe—Co-system alloys (Co, $Co_{90}Fe_{10}$, $Fe_{50}Co_{50}$, $Fe_{80}Co_{20}$ and Fe), respectively. Relations between the materials of the thin-film insertion layers 32, 34 and AΔR obtained thereby are shown below.

| X: | AΔR (mΩm²) |
| --- | --- |
| Co: | 0.6 |
| $Co_{90}Fe_{10}$: | 0.8 |
| $Fe_{50}Co_{50}$: | 1.55 |
| $Fe_{80}Co_{20}$: | 1.45 |
| Fe: | 1.35 |

Note here that, in case the composition X is $Co_{90}Fe_{10}$, it is the same composition as that of the other portions of the pinned layer 16 and the free layer 20, and these other portions are not distinctive from the thin-film insertion layers 32, 34. It has been found from the above result that, in case such Fe—Co-system alloys are used as materials of the thin-film insertion layers 32, 34, the use of $Fe_{50}Co_{50}$, $Fe_{80}Co_{20}$ and Fe whose crystal structures are body-centered cubic crystals is effective to increase AΔR. In contrast, the use of Co has been found to decrease AΔR from the value before the insertion.

Therefore, if Fe—Co-system alloys are used as materials of the thin-film insertion layers 32, 34, those having compositions making body-centered cubic crystal structures are preferably selected.

SIXTH EXAMPLE

As the sixth example, magnetoresistance effect elements having the following film configuration were prepared.

| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As the material X of the thin-film insertion layers 32, 34, five kinds of Fe—Ni-system alloys (Ni, $Ni_{80}Fe_{20}$, $Ni_{50}Fe_{50}$, $Fe_{90}Ni_{10}$ and Fe), respectively. Relations between the materials of the thin-film insertion layers 32, 34 and $A\Delta R$ obtained thereby are shown below.

| X: | $A\Delta R$ (m$\Omega\mu m^2$) |
| --- | --- |
| Not inserted: | 0.8 |
| Ni: | 0.3 |
| $Ni_{80}Fe_{20}$: | 0.4 |
| $Ni_{50}Fe_{50}$: | 0.9 |
| $Fe_{90}Ni_{10}$: | 1.3 |
| Fe: | 1.35 |

It has been found from the above result that, also in case such Fe—Ni-system alloys are used as materials of the thin-film insertion layers 32, 34, the use of $Fe_{90}Ni_{10}$ and Fe whose crystal structures are body-centered cubic crystals is effective to increase $A\Delta R$. In contrast, the use of Ni or $Ni_{80}Fe_{20}$ has been found to decrease $A\Delta R$ from the value before the insertion.

Therefore, also when Fe—Ni-system alloys are used as materials of the thin-film insertion layers 32, 34, those having compositions making body-centered cubic crystal structures are preferably selected.

SEVENTH EXAMPLE

As the seventh example, magnetoresistance effect elements having the following film configuration were prepared.

| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As the material X of the thin-film insertion layers 32, 34, five kinds of Co—Ni-system alloys (Ni, $Ni_{80}Co_{20}$, $Fe_{50}Co_{20}$, $Co_{80}Ni_{10}$ and Co), respectively. Relations between the materials of the thin-film insertion layers 32, 34 and $A\Delta R$ obtained thereby are shown below.

| X: | $A\Delta R$ (m$\Omega\mu m^2$) |
| --- | --- |
| Not inserted: | 0.8 |
| Ni: | 0.3 |
| $Ni_{80}Co_{20}$: | 0.5 |
| $Ni_{50}Co_{50}$: | 1.0 |
| $Co_{90}Ni_{10}$: | 0.8 |
| Co: | 0.6 |

It has been found from the above result that, in case such Co—Ni-system alloys are used as materials of the thin-film insertion layers 32, 34, an effect of increasing $A\Delta R$ is obtained near the composition of $Ni_{50}Co_{50}$. Also, the use of compositions near Ni or Co has been found to decrease $A\Delta R$ from the value before the insertion.

EIGHTH EXAMPLE

As the eighth example, magnetoresistance effect elements having the following film configuration were prepared.

| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As a material of the thin-film insertion layers 32, 34, $(Fe_{50}Co_{50})_{97}Z_3$ prepared by mixing 3 atomic % of an element Z (Cu, Ti, Ga, Hf or Mn) in $Fe_{50}Co_{50}$ was used. Relations between elements Z mixed in $Fe_{50}Co_{50}$ and $A\Delta R$ obtained thereby are shown below.

| Z: | $A\Delta R$ (m$\Omega\mu m^2$) |
| --- | --- |
| Not mixed: | 1.55 |
| Cu: | 2.9 |
| Ti: | 2.7 |
| Ga: | 2.4 |
| Hf: | 2.7 |
| Mn: | 2.2 |

It as been found from the above result that, when a small quantity of any of those elements is contained in the $Fe_{50}Co_{50}$ alloy as the thin-film insertion layer, $A\Delta R$ increases. As a result of further quantitative investigation, it has been found that $A\Delta R$ increases up to approximately 30 atomic % of mixture of each of those elements, but this increase is remarkable when the mixture is 10 atomic % or less. Thus the effect of the mixture has been confirmed to be great in the range not smaller than 5 atomic % and not larger than 10 atomic %.

Also when other elements, namely, Cr, V, Ta, Nb, Zn, Ni and Sc, are mixed respectively, $A\Delta R$ increased. Furthermore, also when Ge, Y, Tc, Re, Ru, Rh, Ir, Pd, Pt, Ag, Au, B, Al, In, C, Si, Sn, Ca, Sr, Ba, O, N and F were mixed respectively, it was effective.

NINTH EXAMPLE

As the ninth example, magnetoresistance effect elements having the following film configuration were prepared.

| | | |
|---|---|---|
| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As a material of the thin-film insertion layers 32, 34, $Fe_{97}Z_3$ prepared by mixing 3 atomic % of an element Z (Cr, V, Ta, Nb Cu, Zn or Ga) in iron (Fe) was used. Relations between elements Z mixed and $A\Delta R$ obtained thereby are shown below.

| Z: | $A\Delta R$ $(m\Omega\mu m^2)$ |
|---|---|
| Not mixed: | 1.35 |
| Cr: | 1.45 |
| V: | 1.45 |
| Ta: | 1.45 |
| Nb: | 1.45 |
| Cu: | 1.80 |
| Zn: | 1.75 |
| Ga: | 1.70 |

It as been found from the above result that, when a small quantity of any of those elements is contained in iron as the thin-film insertion layer, $A\Delta R$ increases. As a result of further quantitative investigation, it has been found that $A\Delta R$ increases up to approximately 30 atomic % of mixture of each of those elements, but this increase is remarkable when the mixture is 10 atomic % or less. Thus the effect of the mixture has been confirmed to be great in the range not smaller than 5 atomic % and not larger than 10 atomic %.

Also when other elements, namely, Co, Ni, Sc, Ge, Y, Tc, Re, Ru, Rh, Ir, Pd, Pt, Ag, Au, B, Al, In, C, Si, Sn, Ca, Sr, Ba, O, N and F, are mixed respectively, $A\Delta R$ increased. Furthermore, also when Fe as the matrix phase was changed to a Fe—Co alloy or Fe—Ni alloy containing Fe by 50 atomic % or more, or a Fe—Co—Ni alloy containing Fe by 25 atomic % or more, equivalent effects were obtained.

TENTH EXAMPLE

As the tenth example, magnetoresistance effect elements having the following film configuration were prepared.

| | | |
|---|---|---|
| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As a material of the thin-film insertion layers 32, 34, $Co_{97}Z_3$ prepared by mixing 3 atomic % of an element Z (Sc, Ti, Mn, Cu or Hf) in cobalt (Co) was used. Relations between elements Z mixed and $A\Delta R$ obtained thereby are shown below.

| Z: | $A\Delta R$ $(m\Omega\mu m^2)$ |
|---|---|
| Not mixed: | 0.6 |
| Sc: | 1.0 |
| Ti: | 1.2 |
| Mn: | 1.0 |
| Cu: | 1.5 |
| Hf: | 1.0 |

It has been found from the above result that, when a small quantity of any of those elements is contained in cobalt as the thin-film insertion layer, $A\Delta R$ increases. As a result of further quantitative investigation, it has been found that $A\Delta R$ increases up to approximately 30 atomic % of mixture of each of those elements, but this increase is remarkable when the mixture is 10 atomic % or less. Thus the effect of the mixture has been confirmed to be great in the range not smaller than 5 atomic % and not larger than 10 atomic %.

Also when other elements, namely, Fe, Ni, Cr, V, Ta, Nb, Zn, Ga, Ge Zr, Y, Tc, Re, Ru, Rh, Ir, Pd, Pt, Ag, Au, B, Al, In, C, Si, Sn, Ca, Sr, Ba, O, N and F, are mixed respectively, $A\Delta R$ increased. Furthermore, also when Co as the matrix phase was changed to a Co—Ni alloy containing Co by 50 atomic % or more, or a Fe—Co—Ni alloy containing Co by 25 atomic % or more, equivalent effects were obtained.

ELEVENTH EXAMPLE

As the eleventh example, magnetoresistance effect elements having the following film configuration were prepared.

| | | |
|---|---|---|
| Protective layer 22: | Ta | (10 nm) |
| Part of the free layer 20: | $Co_{90}Fe_{10}$ | (3 nm) |
| Thin-film insertion layer 34: | X | (2 nm) |
| Nonmagnetic intermediate layer 18: | Cu | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As a material of the thin-film insertion layers 32, 34, $Ni_{97}Z_3$ prepared by mixing 3 atomic % of an element Z (Ti, Mn, Zn, Ga, Ge, Zr or Hf) in nickel (Ni) was used. Relations between elements Z mixed and $A\Delta R$ obtained thereby are shown below.

| Z: | $A\Delta R$ $(m\Omega\mu m^2)$ |
|---|---|
| Not mixed: | 0.3 |
| Ti: | 0.8 |
| Mn: | 0.9 |
| Zn: | 1.0 |
| Ga: | 0.9 |
| Ge: | 0.8 |
| Zr: | 1.0 |
| Hf: | 1.2 |

It has been found from the above result that, when a small quantity of any of those elements is contained in nickel as the thin-film insertion layer, $A\Delta R$ increases. As a result of further quantitative investigation, it has been found that $A\Delta R$ increases up to approximately 30 atomic % of mixture of each of those elements, but this increase is remarkable when the mixture is 10 atomic % or less. Thus the effect of the mixture has been confirmed to be great in the range not smaller than 5 atomic % and not larger than 10 atomic %.

Also when other elements, namely, Fe, Co, Cr, V, Ta, Nb, Sc, Cu, Y, Te, Re, Ru, Rh, Ir, Pd, Pt, Ag, Au, B, Al, In, C, Si, Sn, Ca, Sr, Ba, O, N or F, are mixed respectively, $A\Delta R$ increased. Furthermore, also when nickel as the matrix phase was changed to a Ni—Fe or Ni—Co alloy containing nickel by 50 atomic % or more, or a Fe—Co—Ni alloy containing nickel by 25 atomic % or more, equivalent effects were obtained.

TWELFTH EXAMPLE

As the twelfth example, magnetoresistance effect elements having the following film configuration were prepared.

| Protective layer 22: | Ta | (10 nm) |
|---|---|---|
| Part of the free layer 20: | $Co_{90}Fe_{10}$ | (3 nm) |
| Thin-film insertion layer 34: | X | (2–2.3 nm) |
| Nonmagnetic intermediate layer 18: | Cu | (3 nm) |
| Thin-film insertion layer 32: | X | (2–2.3 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As materials X of the thin-film insertion layers 32, 34, the following four kinds of materials were used.

(1) $Fe_{50}Co_{50}$ (2 nm)

(2) $(Fe_{50}Co_{50})_{97}Cu_3$ (2 nm)

(3) $Fe_{50}Co_{50}$ (1 nm)/Cu (0.1 nm)/$Fe_{50}Co_{50}$ (1 nm)

(4) $Fe_{50}Co_{50}$ (0.7 nm)/Cu (0.1 nm)/$Fe_{50}Co_{50}$ (0.7 nm)/Cu (0.1 nm)/$Fe_{50}Co_{50}$ (0.7 nm)

In the multi-layered structures shown above, the order of respective layers are from near to away from the lower electrode. Relations between compositions X of the thin-film insertion layers 32, 34 and $A\Delta R$ obtained thereby are shown below.

| X: | $A\Delta R$ (m$\Omega\mu m^2$) |
|---|---|
| (1): | 1.55 |
| (2): | 2.9 |
| (3): | 3.1 |
| (4): | 3.3 |

It is appreciated from the result shown above that larger $A\Delta R$ can be obtained when the Cu layer is periodically inserted than when Cu is uniformly mixed in $Fe_{50}Co_{50}$.

This tendency was not limited to Cu, but also confirmed in structures made by periodically inserting a layer that contains at least one kind of element selected from the group consisting of chromium (Cr), vanadium (V), tantalum (Ta), niobium (Nb), scandium (Sc), titanium (Ti), manganese (Mn), zinc (Zn), gallium (Ga), germanium (Ge), zirconium (Zr), hafnium (Hf), yttrium (Y), technetium (Tc), rhenium (Re), ruthenium (Ru), rhodium (Rh), iridium (Ir), palladium (Pd), platinum (Pt), silver (Ag), gold (Au), boron (B), aluminum (Al), indium (In), carbon (C), silicon (Si), tin (Sn), calcium (Ca), strontium (Sr), barium (Ba), oxygen (O), nitrogen (N) and fluorine (F), and has a thickness not thinner than 0.03 nm and not exceeding 1 nm, which permits it to exist as a body-centered cubic structure in the Fe—Co alloy.

THIRTEENTH EXAMPLE

As the thirteenth example, magnetoresistance effect elements having the following film configuration were prepared.

| Protective layer 22: | Ta | (10 nm) |
|---|---|---|
| Part of the free layer 20: | $Co_{90}Fe_{10}$ | (4.5 nm) |
| Thin-film insertion layer 34: | X | (0.5 nm) |
| Nonmagnetic intermediate layer 18: | Cu | (3 nm) |
| Thin-film insertion layer 32: | X | (0.5 nm) |
| Part of the pinned layer 16: | $Co_{90}Fe_{10}$ | (4.5 nm) |
| Anti-ferromagnetic layer 14: | PtMn | (15 nm) |
| Second base layer 12: | NiFeCr | (5 nm) |
| First base layer 12: | Ta | (5 nm) |

As materials X of the thin-film insertion layers, $Fe_{1-z}Cr_z$ was used. Relations among Cr quantity Z in the thin-film insertion layer 32 or 34, thickness of the thin-film insertion layer and $A\Delta R$ obtained are shown below. For comparison purposes, data of a structure without the thin-film insertion layer and data of a structure with 2 nm thick pure Fe inserted are also shown.

| Z: | (thickness) | $A\Delta R$ (m$\Omega\mu m^2$) |
|---|---|---|
| 0 | (0 nm): | 0.8 |
| 0 | (2 nm): | 1.35 |
| 0 | (0.5 nm): | 0.9 |
| 10 | (0.5 nm): | 1.3 |
| 30 | (0.5 nm): | 1.5 |
| 60 | (0.5 nm): | 1.4 |
| 80 | (0.5 nm): | 1.2 |

The above result is explained below. When the 2 nm thick thin-film insertion layer of pure Fe (Z=0) was inserted, $A\Delta R$ increased from 0.8 (m$\Omega\mu m^2$) to 1.35 (m$\Omega\mu m^2$). This can be explained as follows.

In case of such a ferromagnetic transition metal, the s-band, p-band and d-band form a mixed band near a portion closer in energy. Majority spins have a Fermi level in an energy position offset from the mixed band, and do not scatter easily. However, minority spins have a Fermi level in the region of the mixed band, and are liable to scatter. This is the origin of the magnetoresistance effect. Therefore, for estimating whether the magnetoresistance change is large or small, it is an index how near to the center of the mixed band those minority spins have the Fermi level, or how far from the mixed band those majority spins have the Fermi level.

Transition metals can typically form face-centered cubic crystals and body-centered cubic crystals as their crystal structures. In case of a metal system including Fe, Co and Ni, for example, the Fermi level of minority spins is generally more centered in the mixed band when the metal forms a body-centered cubic crystal than a face-centered cubic crystal. Therefore, body-centered cubic crystals are more desirable for increasing the magnetoresistance effect. This may be one of reasons why $A\Delta R$ rises when pure Fe is inserted as the thin-film insertion layer in this Example.

If the thickness of pure Fe is thinned from 2 nm to 0.5 nm, then $A\Delta R$ decreases to 0.9 (m$\Omega\mu m^2$). This is probably because very thin Fe is difficult to form a body-centered cubic crystal as its crystal structure. In contrast, when Cr was contained in the thin-film insertion layer so as to reliably form a body-centered cubic crystal over the entire composition range, $A\Delta R$ increased more than the use of pure Fe (0.5 nm).

Curie temperatures of Fe—Cr alloys decrease as Cr is increased, and these alloys exhibit paramagnetism at room temperatures when Cr is increased to 70 atomic % or more. However, if Fe—Cr itself is very thin and a ferromagnetic material is adjacently located, ferromagnetism is induced, and a magnetoresistance effect is obtained.

FOURTEENTH EXAMPLE

As the fourteenth example, magnetoresistance effect elements having the following film configuration were prepared.

| Protective layer 22: | Ta | (10 nm) |
|---|---|---|
| Part of the free layer 20: | $Co_{90}Fe_{10}$ | (4.5 nm) |
| Thin-film insertion layer 34: | X | (0.5 nm) |
| Nonmagnetic intermediate layer 18: | Cu | (3 nm) |
| Thin-film insertion layer 32: | X | (0.5 nm) |
| Part of the pinned layer 16: | $Co_{90}Fe_{10}$ | (4.5 nm) |
| Anti-ferromagnetic layer 14: | PtMn | (15 nm) |
| Second base layer 12: | NiFeCr | (5 nm) |
| First base layer 12: | Ta | (5 nm) |

As materials X of the thin-film insertion layers, $Fe_{1-z}V_z$ was used. Relations among V quantity Z in the thin-film insertion layer 32 or 34, thickness of the thin-film insertion layer and AΔR obtained are shown below. For comparison purposes, data of a structure without the thin-film insertion layer and data of a structure with 2 nm thick pure Fe inserted are also shown.

| Z | (thickness) | AΔR (mΩμm$^2$) |
|---|---|---|
| 0 | (0 nm): | 0.8 |
| 0 | (2 nm): | 1.35 |
| 0 | (0.5 nm): | 0.9 |
| 10 | (0.5 nm): | 1.2 |
| 30 | (0.5 nm): | 1.3 |
| 60 | (0.5 nm): | 1.1 |
| 80 | (0.5 nm): | 1.1 |

As already explained in conjunction with the eighth example, the effect of increasing AΔR by insertion of Fe forming a body-centered cubic crystal slightly degrades when the thin-film insertion film is very thin. Taking it into account, the content of V was adjusted to stabilize the body-centered cubic crystal. Then AΔR recovered.

Fe—V alloys also exhibit paramagnetism when V occupies 70 atomic % or more. However, if Fe—V itself is very thin and a ferromagnetic material is adjacently located, ferromagnetism is induced, and a magnetoresistance effect is obtained.

Increase of AΔR by stabilization of the body-centered cubic crystal mentioned above was confirmed also when using Fe—Co alloys (Co: not exceeding 80 atomic %), Fe—Ni alloys (Ni: not exceeding 10 atomic %), Fe—Rh alloys (Rh: 11 to 55 atomic %), Fe—Ti alloys (Ti: 49 to 51 atomic %), Fe—Co—Ni alloys in the composition region of body-centered cubic crystals, and Co—Mn—Fe alloys in the composition region of body-centered cubic crystals.

Furthermore, an effect of increasing AΔR was confirmed also when using these alloys as the matrix phase and mixing 0.5 to 30 atomic % of at least one kind of element selected from the group consisting of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr and Ba and not included in the matrix alloys.

FIFTEENTH EXAMPLE

As he fifteenth example of the invention, a version using Au (gold) as the nonmagnetic intermediate layer 18. In this example, magnetoresistance effect elements having the following film configuration were prepared.

| Protective layer 22: | Ta | (10 nm) |
|---|---|---|
| Part of the free layer 20: | $Co_{90}Fe_{10}$ | (3 nm) |
| Thin-film insertion layer 34: | X | (2 nm) |
| Nonmagnetic intermediate layer 18: | Au | (3 nm) |
| Thin-film insertion layer 32: | X | (2 nm) |
| Part of the pinned layer 16: | $Co_{90}Fe_{10}$ | (3 nm) |
| Anti-ferromagnetic layer 14: | PtMn | (15 nm) |
| Second base layer 12: | NiFeCr | (5 nm) |
| First base layer 12: | Ta | (5 nm) |

As materials X of the thin-film insertion layers, five kinds of Fe—Co alloys (Co, $Co_{90}Fe_{10}$, $Fe_{50}Co_{50}$, $Fe_{80}Co_{20}$ and Fe) were used. Values of AΔR obtained are shown below. For comparison purposes, data of a structure without the thin-film insertion layer and data of a structure with 2 nm thick pure Fe inserted are also shown.

| X | AΔR (mΩμm$^2$) |
|---|---|
| Co: | 0.3 |
| $Co_{90}Fe_{10}$: | 0.4 |
| $Fe_{50}Co_{50}$: | 0.9 |
| $Fe_{80}Co_{20}$: | 1.45 |
| Fe: | 1.7 |

As shown above, as Fe concentration in the thin-film insertion layers 32, 34 using Au as the nonmagnetic intermediate layer 18 increases, AΔR tended to increase. As such, to increase AΔR, it is important to appropriately select materials of the thin-film insertion layer 32, 34 in accordance with the material of the nonmagnetic intermediate layer 18.

SIXTEENTH EXAMPLE

Figure 14:
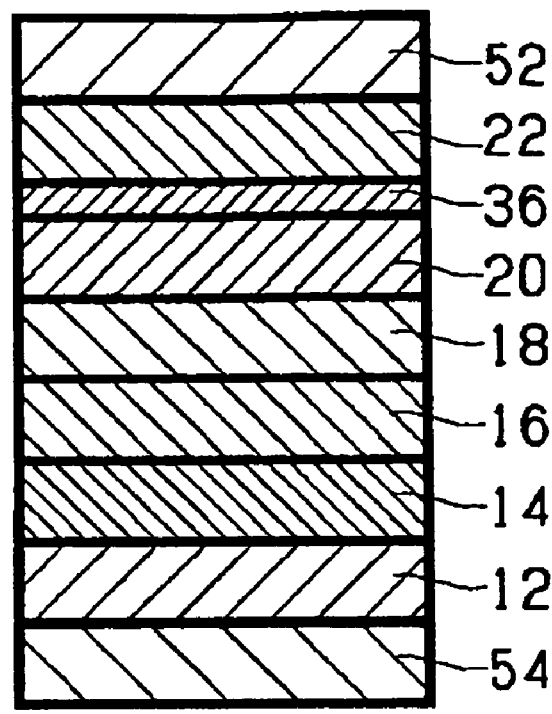
FIG. 14 is a diagram that schematically shows a structure having a back insertion layer 36 experimentally prepared as the sixteenth embodiment of the invention.
Figure 15:
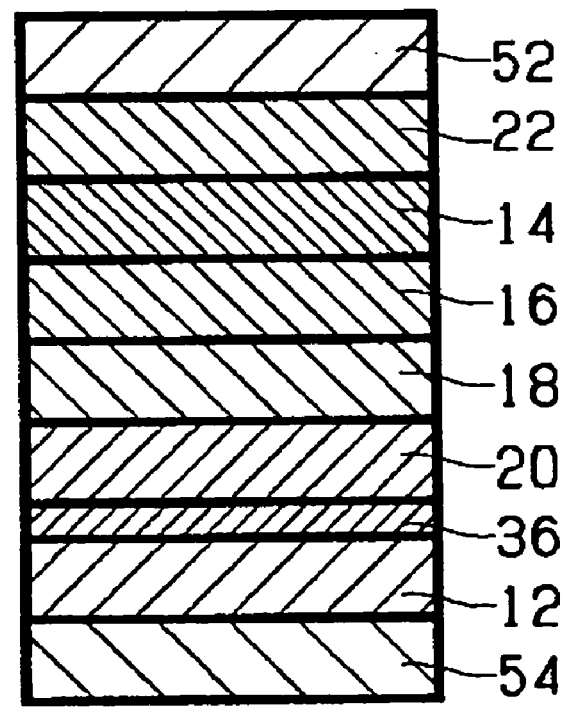
FIG. 15 is a diagram that schematically shows a structure locating an anti-ferromagnetic layer 14 in an upper position.

As the sixteenth example of the invention, a structure having a back insertion layer 36 as shown in FIG. 14 was reviewed. Its result is explained below. First, magnetoresistance effect elements having the thin-film insertion layers as shown below were prepared, and their results were investigated.

Sample A: standard structure (FIG. 1)

| Protective layer 22: | Ta | (10 nm) |
|---|---|---|
| Part of the free layer 20: | $Co_{90}Fe_{10}$ | (4 nm) |
| Thin-film insertion layer 34: | $Fe_{50}Co_{50}$ | (1 nm) |
| Nonmagnetic intermediate layer 18: | Cu | (3 nm) |
| Thin-film insertion layer 32: | $Fe_{50}Co_{50}$ | (1 nm) |
| Part of the pinned layer 16: | $Co_{90}Fe_{10}$ | (4 nm) |
| Anti-ferromagnetic layer 14: | PtMn | (15 nm) |
| Second base layer 12: | NiFeCr | (5 nm) |
| First base layer 12: | Ta | (5 nm) |

Sample B: structure having the back insertion layer (FIG. 14).

| Protective layer 22: | Ta | (10 nm) |
| Back insertion layer 36: | Cu | (1 nm) |
| Part of the free layer 20: | Co$_{90}$Fe$_{10}$ | (4 nm) |
| Thin-film insertion layer 34: | Fe$_{50}$Co$_{50}$ | (1 nm) |
| Nonmagnetic intermediate layer 18: | Cu | (3 nm) |
| Thin-film insertion layer 32: | Fe$_{50}$Co$_{50}$ | (1 nm) |
| Part of the pinned layer 16: | Co$_{90}$Fe$_{10}$ | (4 nm) |
| Anti-ferromagnetic layer 14: | PtMn | (15 nm) |
| Second base layer 12: | NiFeCr | (5 nm) |
| First base layer 12: | Ta | (5 nm) |

AΔR of Sample A was 1.2 (MΩμm$^2$), but AΔR of Sample B having the back insertion layer 36 increased up to 1.5 (mΩμm$^2$). This is probably because spin-dependent interface scattering occurred along the interface between the free layer 20 and the back insertion layer 36.

This effect can be obtained also when the anti-ferromagnetic layer 14 is located in an upper position.

SEVENTEENTH EXAMPLE

As the seventeenth example of the invention, a review was made about effects obtained by inserting thin-film insertion layers in structures having the back insertion layer 36. Its result is explained below. First, seven different Samples C through I were prepared as magnetoresistance effect elements having the back insertion layer as shown below, and effects obtained thereby were reviewed.

Sample C: not including thin-film insertion layers (FIG. 14)

| Protective layer 22: | Ta | (10 nm) |
| Back insertion layer 36: | Cu | (1 nm) |
| Part of the free layer 20: | Co$_{90}$Fe$_{10}$ | (5 nm) |
| Nonmagnetic intermediate layer 18: | Cu | (3 nm) |
| Pinned layer 16: | Co$_{90}$Fe$_{10}$ | (4 nm) |
| Anti-ferromagnetic layer 14: | PtMn | (15 nm) |
| Second base layer 12: | NiFeCr | (5 nm) |
| First base layer 12: | Ta | (5 nm) |

Figure 16:
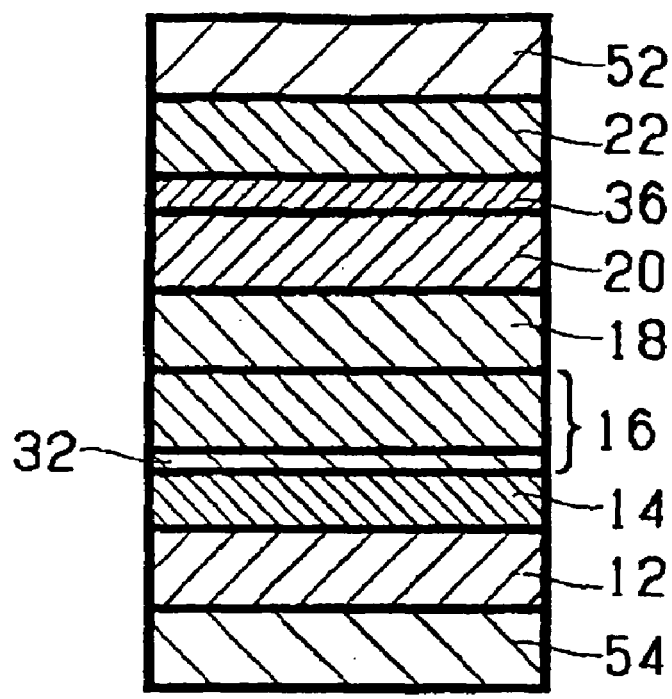
FIG. 16 is a diagram that schematically shows a structure inserting a thin-film insertion layer 32 between a pinned layer 16 and the anti-ferromagnetic layer 14.

Sample D: inserting the thin-film inserting layer 32 between the pinned layer 16 and the anti-ferromagnetic layer 14 (FIG. 16)

| Protective layer 22: | Ta | (10 nm) |
| Back insertion layer 36: | Cu | (1 nm) |
| Part of the free layer 20: | Co$_{90}$Fe$_{10}$ | (5 nm) |
| Nonmagnetic intermediate layer 18: | Cu | (3 nm) |
| Part of the pinned layer 16: | Co$_{90}$Fe$_{10}$ | (4 nm) |
| Thin-film insertion layer 32: | Fe$_{50}$Co$_{50}$ | (1 nm) |
| Anti-ferromagnetic layer 14: | PtMn | (15 nm) |
| Second base layer 12: | NiFeCr | (5 nm) |
| First base layer 12: | Ta | (5 nm) |

Figure 17:
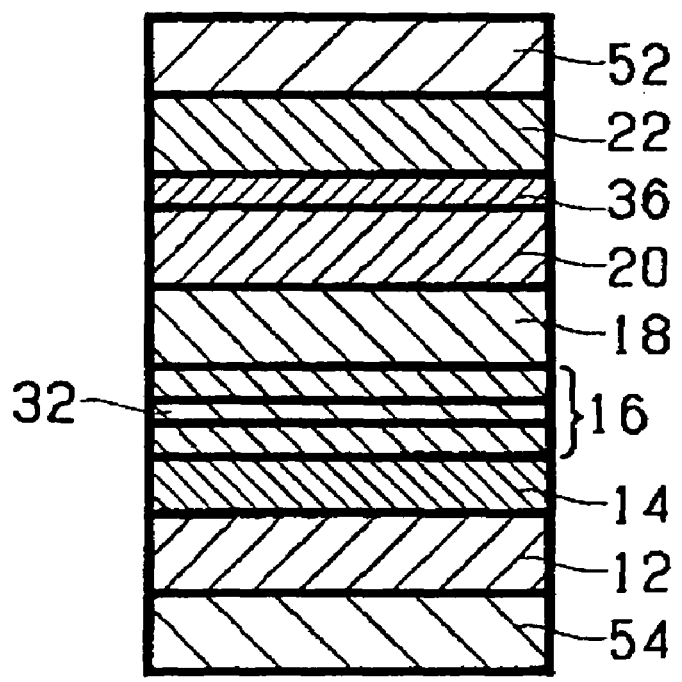
FIG. 17 is a diagram that schematically showing a structure inserting the thin-film insertion layer 32 inside the pinned layer 16.

Sample E: inserting the thin-film insertion layer 32 in the pinned layer 16 (FIG. 17)

| Protective layer 22: | Ta | (10 nm) |
| Back insertion layer 36: | Cu | (1 nm) |
| Part of the free layer 20: | Co$_{90}$Fe$_{10}$ | (5 nm) |
| Nonmagnetic intermediate layer 18: | Cu | (3 nm) |
| Part of the pinned layer 16: | Co$_{90}$Fe$_{10}$ | (2 nm) |
| Thin-film insertion layer 32: | Fe$_{50}$Co$_{50}$ | (1 nm) |
| Part of the pinned layer 16: | Co$_{90}$Fe$_{10}$ | (2 nm) |
| Anti-ferromagnetic layer 14: | PtMn | (15 nm) |
| Second base layer 12: | NiFeCr | (5 nm) |
| First base layer 12: | Ta | (5 nm) |

Figure 18:
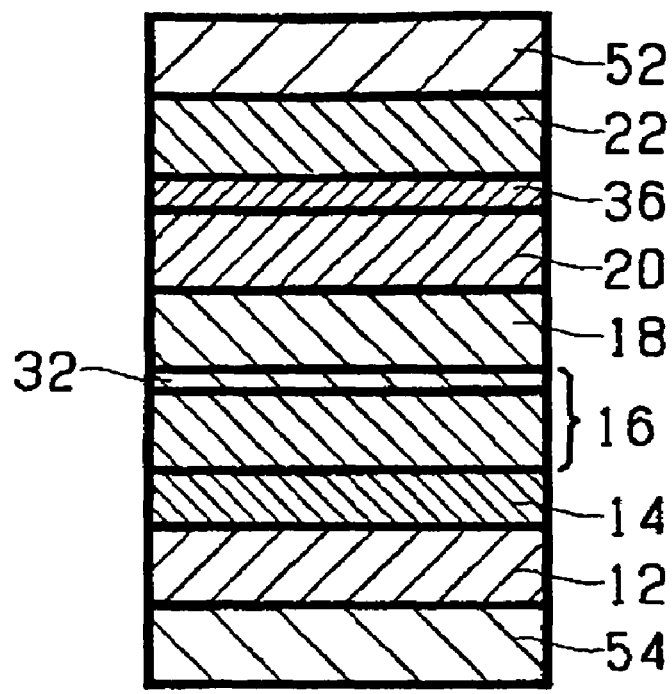
FIG. 18 is a diagram that schematically shows a structure inserting the thin-film insertion layer 32 between the pinned layer 16 and a nonmagnetic intermediate layer 18.

Sample F: inserting the thin-film insertion layer 32 between the pinned layer 16 and the nonmagnetic intermediate layer 18 (FIG. 18)

| Protective layer 22: | Ta | (10 nm) |
| Back insertion layer 36: | Cu | (1 nm) |
| Part of the free layer 20: | Co$_{90}$Fe$_{10}$ | (5 nm) |
| Nonmagnetic intermediate layer 18: | Cu | (3 nm) |
| Thin-film insertion layer 32: | Fe$_{50}$Co$_{50}$ | (1 nm) |
| Part of the pinned layer 16: | Co$_{90}$Fe$_{10}$ | (4 nm) |
| Anti-ferromagnetic layer 14: | PtMn | (15 nm) |
| Second base layer 12: | NiFeCr | (5 nm) |
| First base layer 12; | Ta | (5 nm) |

Figure 19:
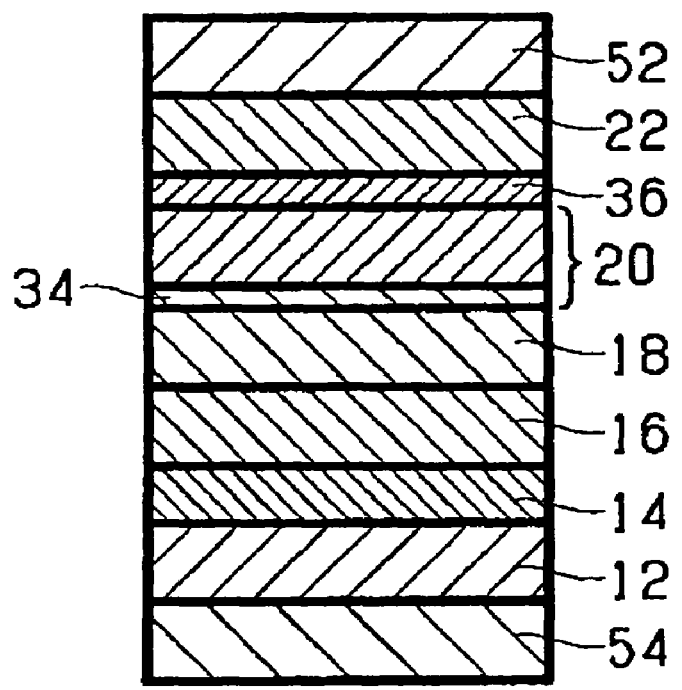
FIG. 19 is a diagram that schematically shows a structure inserting the thin-film insertion layer 34 between the nonmagnetic intermediate layer 18 and the free layer 20.

Sample G: inserting the thin-film insertion layer 34 between the nonmagnetic intermediate layer 18 and the free layer 20 (FIG. 19)

| Protective layer 22: | Ta | (10 nm) |
| Back insertion layer 36: | Cu | (1 nm) |
| Part of the free layer 20: | Co$_{90}$Fe$_{10}$ | (4 nm) |
| Thin-film insertion layer 32: | Fe$_{50}$Co$_{50}$ | (1 nm) |
| Nonmagnetic intermediate layer 18: | Cu | (3 nm) |
| Pinned layer 16: | Co$_{90}$Fe$_{10}$ | (5 nm) |
| Anti-ferromagnetic layer 14: | PtMn | (15 nm) |
| Second base layer 12: | NiFeCr | (5 nm) |
| First base layer 12: | Ta | (5 nm) |

Figure 20:
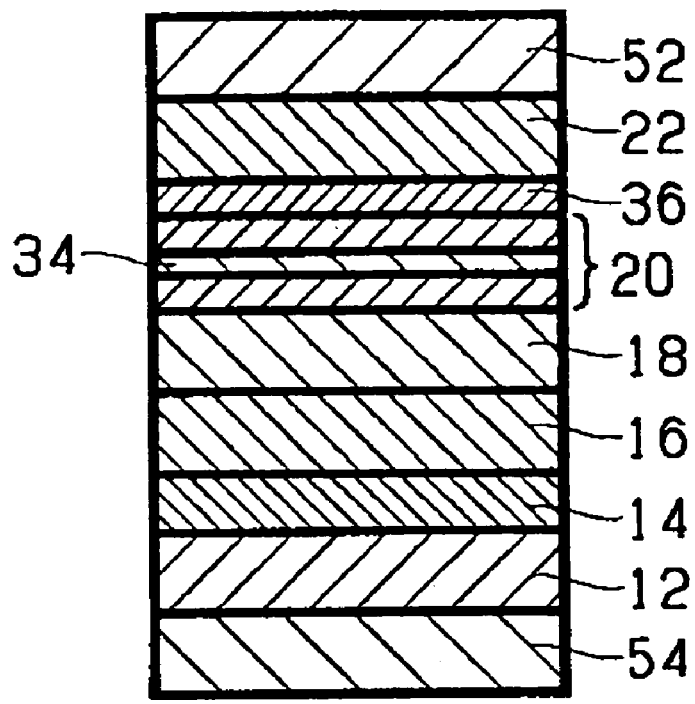
FIG. 20 is a diagram that schematically shows a structure inserting the thin-film insertion layer 34 inside the free layer 20.

Sample H: inserting the thin-film insertion layer 34 in the free layer 20 (FIG. 20)

| Protective layer 22: | Ta | (10 nm) |
| Back insertion layer 36: | Cu | (1 nm) |
| Part of the free layer 20: | Co$_{90}$Fe$_{10}$ | (2 nm) |
| Thin-film insertion layer 34: | Fe$_{50}$Co$_{50}$ | (1 nm) |
| Part of the free layer 20: | Co$_{90}$Fe$_{10}$ | (2 nm) |
| Nonmagnetic intermediate layer 18: | Cu | (3 nm) |
| Pinned layer 16: | Co$_{90}$Fe$_{10}$ | (5 nm) |
| Anti-ferromagnetic layer 14: | PtMn | (15 nm) |
| Second base layer 12: | NiFeCr | (5 nm) |
| First base layer 12: | Ta | (5 nm) |

Figure 21:
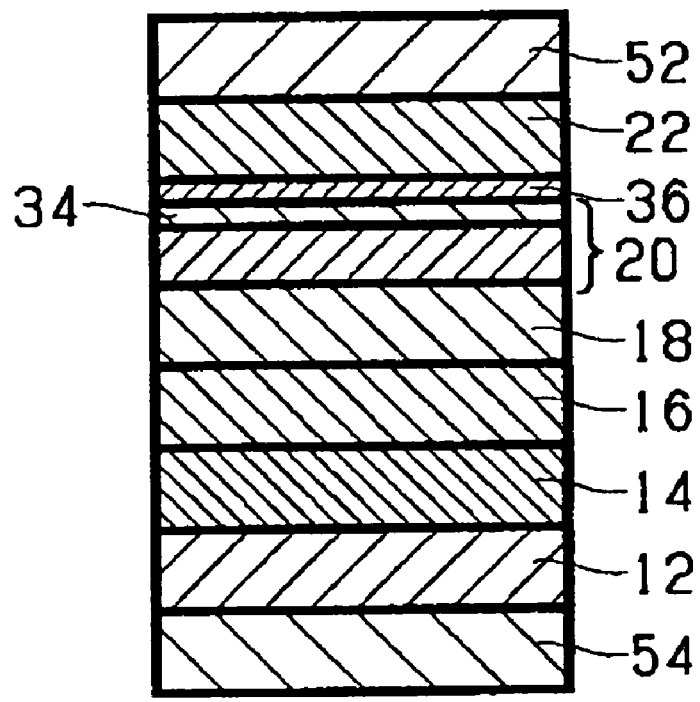
FIG. 21 is a diagram that schematically shows a structure inserting the thin-film insertion layer 34 between the free layer 20 and the back insertion layer 36.

Sample I: inserting the thin-film insertion layer 34 between the free layer 20 and the back insertion layer 36 (FIG. 21)

| Protective layer 22: | Ta | (10 nm) |
| Back insertion layer 36: | Cu | (1 nm) |
| Thin-film insertion layer 34: | Fe$_{50}$Co$_{50}$ | (1 nm) |
| Part of the free layer 20: | Co$_{90}$Fe$_{10}$ | (4 nm) |
| Nonmagnetic intermediate layer 18: | Cu | (3 nm) |
| Pinned layer 16: | Co$_{90}$Fe$_{10}$ | (5 nm) |
| Anti-ferromagnetic layer 14: | PtMn | (15 nm) |
| Second base layer 12: | NiFeCr | (5 nm) |
| First base layer 12: | Ta | (5 nm) |

With Samples C through I, $A\Delta R$ was evaluated. Its result is as follows.

| Sample | $A\Delta R$ (m$\Omega\mu m^2$) |
|---|---|
| C: | 0.9 |
| D: | 1.0 |
| E: | 1.0 |
| F: | 1.2 |
| G: | 1.2 |
| H: | 1.0 |
| I: | 1.1 |

The effect of increasing $A\Delta R$ was largest when the thin-film insertion layer 32 or 34 was located along the interface between the pinned layer 16 and the nonmagnetic intermediate layer (Sample F) or along the interface between the free layer 20 and the nonmagnetic intermediate layer 18 (Sample G). The effect was next largest when the layer 32 or 34 was inserted as the interface between the free layer 20 and the back insertion layer 36. This is probably caused by an increase of spin-dependent interface scattering.

Even in Samples D, E and H, $A\Delta R$ increases to a certain extent. One of reasons there of is that spin-dependent bulk scattering is larger in $Co_{90}Fe_{10}$ than in $Co_{50}Fe_{50}$. Additionally, the increase can rely on that the band structure of the pinned layer or free layer is modulated by the multi-layered crystal structure including the layer of a face-centered cubic crystal and a layer of the body-centered cubic crystal, and thereby increases the difference in conductivity between majority spins and minority spins.

EIGHTEENTH EXAMPLE

In the preceding seventeenth example, effects by the location of one thin-film insertion layer were discussed. The instant example combines Samples F, G and I that were remarkably effective to enhance the increase of $A\Delta R$. More specifically, Samples J and K were prepared as magnetoresistance effect elements having the back insertion layer, and their properties were reviewed.

Sample J: locating the $Fe_{50}Co_{50}$ thin-film insertion layer as the interface between the pinned layer 16 and the nonmagnetic intermediate layer 18, and as the interface between the free layer 20 and the nonmagnetic intermediate layer 18

| Protective layer 22: | Ta | (10 nm) |
|---|---|---|
| Back insertion layer 36: | Cu | (1 nm) |
| Part of the free layer 20: | $Co_{90}Fe_{10}$ | (4 nm) |
| Thin-film insertion layer 34: | $Fe_{50}Co_{50}$ | (1 nm) |
| Nonmagnetic intermediate layer 18: | Cu | (3 nm) |
| Thin-film insertion layer 34: | $Fe_{50}Co_{50}$ | (1 nm) |
| Part of the pinned layer 16: | $Co_{90}Fe_{10}$ | (4 nm) |
| Anti-ferromagnetic layer 14: | PtMn | (15 nm) |
| Second base layer 12: | NiFeCr | (5 nm) |
| First base layer 12: | Ta | (5 nm) |

Sample K: locating the $Fe_{50}Co_{50}$ thin-film insertion layer as the interface between the pinned layer 16 and the nonmagnetic intermediate layer 18, and as the interface between the free layer 20 and the back insertion layer 36

| Protective layer 22: | Ta | (10 nm) |
|---|---|---|
| Back insertion layer 36: | Cu | (1 nm) |
| Thin-film insertion layer 32: | $Fe_{50}Co_{50}$ | (1 nm) |
| Part of the free layer 20: | $Co_{90}Fe_{10}$ | (4 nm) |
| Thin-film insertion layer 32: | $Fe_{50}Co_{50}$ | (1 nm) |
| Nonmagnetic intermediate layer 18: | Cu | (3 nm) |
| Thin-film insertion layer 32: | $Fe_{50}Co_{50}$ | (1 nm) |
| Part of the pinned layer 16: | $Co_{90}Fe_{10}$ | (4 nm) |
| Anti-ferromagnetic layer 14: | PtMn | (15 nm) |
| Second base layer 12: | NiFeCr | (5 nm) |
| First base layer 12: | Ta | (5 nm) |

As a result, $A\Delta R$ was as high as 1.3 (m$\Omega\mu m^2$) in Sample J, and as high as 1.7 (m$\Omega\mu m^2$) in Sample K as expected, and as compared with Sample F and Sample G ($A\Delta R=1.2$ (m$\Omega\mu m^2$)) and Sample I ($A\Delta R=1.1$ (m$\Omega\mu m^2$)) inserting only one thin-film insertion layer, increase of $A\Delta R$ was confirmed.

NINETEENTH EXAMPLE

In this example, a top-type spin valve structure locating the anti-ferromagnetic layer 14 in an upper position as shown in FIG. 2 was prepared, and its properties were evaluated. As a result, similarly to the foregoing examples, an effect of increasing the magnetoresistance change by the thin-film insertions layers 32, 34 and back insertion layer 36 was confirmed.

TWENTIETH EXAMPLE

In this example, an effect of inserting the thin-film insertion layers 32, 34 and back insertion layer 36 in magnetoresistance effect elements of a "multi-layered ferri-structure" was estimated.

FIG. 3 is a diagram that schematically shows a cross-sectional structure of a magnetoresistance effect element having a multi-layered ferri-structure. That is, the first pinned layer 16A and the second pinned layer 16B are stacked via the anti-parallel coupling layer 40. Also in the magnetoresistance effect element having the pinned layer of the multi-layered ferri-structure, an effect of increasing the magnetoresistance change by the use of the thin-film insertion layers 32, 34 and back insertion layer 36 was confirmed similarly to the foregoing examples.

Figure 22:
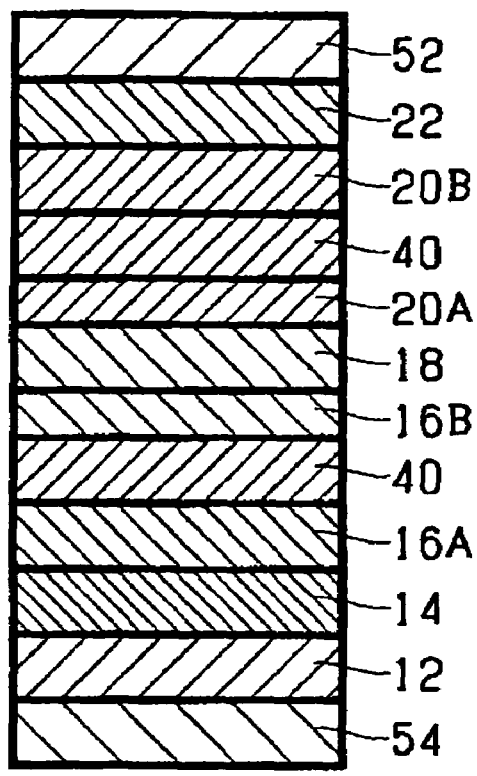
FIG. 22 is a diagram that schematically shows another specific example of the cross-sectional structure of a magnetoresistance effect element having a multi-layered ferri-structure.

FIG. 22 is a diagram that schematically shows another specific example of the cross-sectional structure of a magnetoresistance effect element having a multi-layered ferri-structure.

More specifically, the magnetoresistance effect element shown here has a structure depositing the lower electrode 54, base layer 12, anti-ferromagnetic layer 14, pinned layer 16 in form of a three-layered structure of the first pined layer 16A, anti-parallel coupling layer 40 and second pinned layer 16B, nonmagnetic intermediate layer 18, free layer 20 in form of a three-layered structure of the first pinned layer 20A, anti-parallel coupling layer 40 and second free layer 20B, protective layer 22 and upper electrode 52 sequentially in this order.

Also in the magnetoresistance effect element having the pinned layer 16 and the free layer 20 each in form of a multi-layered ferri-structure, an effect of increasing the magnetoresistance change by the use of the thin-film insertion layers 32, 34 and back insertion layer 36 was confirmed similarly to the foregoing examples.

TWENTY-FIRST EXAMPLE

Figure 23:
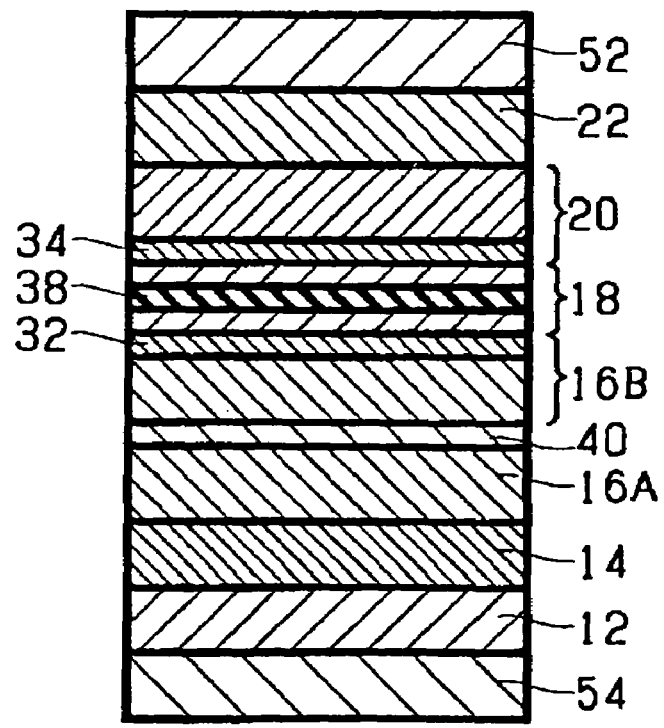
FIG. 23 is a diagram that schematically shows a cross-sectional structure of a magnetoresistance effect element having a resistance adjusting layer.

FIG. 23 is a diagram that schematically shows a cross-sectional structure of a magnetoresistance effect element having a resistance adjusting layer. A resistance adjusting layer 38 having a high-resistance made by oxidizing a $Cu_{10}Cr_{90}$ alloy is inserted in the nonmagnetic intermediate layer 18. The resistance adjusting layer 38 locally includes low-resistance, conductive regions as pinholes, and the sense current by perpendicular current supply will concentrically flows into the pinholes. As a result, its effective current-supply region is narrowed, and it results in increasing the output. If only a current-supply region exhibiting large spin-dependent scattering can be narrowed, the increase of the resistance change (A$\Delta$R) will increase relative to the increase of the entire resistance value (AR), and the ratio of resistance change (MR=A$\Delta$R/AR) will increase accordingly. Therefore, larger effect is expected by combining a spin valve element according to the embodiment of the invention having a thin-film insertion layer with large spin-dependent scattering along the interface. Using a SyAF structure, samples with and without the resistance adjusting layer 38 and with and without the interface insertion layers 32 and 34 were compared.

Sample A: Ta 5 nm/NiFeCr 5 nm/PtMn 15 nm/$(Co_{90}Fe_{10})_{90}Cr_{10}$ 3 nm/Ru
  1 nm/$Fe_{80}Co_{50}$ 2.5 nm/$Fe_{80}Co_{20}$ 1 nm/Cu 2 nm/$Fe_{50}Co_{50}$ $Co_{50}$ 0.5
  nm/$Ni_{80}Fe_{20}$ 3 nm/$Co_{90}Fe_{10}$ 1 nm/Ta 10 nm Sample B: Ta 5 nm/NiFeCr 5 nm/PtMn 15 nm/$(Co_{90}Fe_{10})_{xCr10}$ 3 nm/Ru
  1 nm/$Fe_{50}Co_{50}$ 2.5 nm/$Fe_{80}Co_{20}$ 1 nm/Cu
  0.2 nm/$(Cu_{10}Cr_{80})$—O 0.8 nm/Cu 0.2 nm/$Ni_{80}Fe_{20}$
  3.5 nm/$Co_{90}Fe_{10}$ 1 nm/Cu 1 nm/Ta 10 nm Sample C: Ta 5 nm/NiFeCr 5 nm/PtMn 15 nm/$(Co_{90}Fe_{10})_{90}$ $Cr_{10}$ 3 nm/Ru
  1 nm/$Fe_{50}Co_{50}$ 2.5 nm/$Fe_{80}Co_{20}$ 1 nm/Cu
  0.2 nm/$(Cu_{10}Cr_{90})$—O 0.8 nm/Cu 0.2 nm/$Fe_{50}Co_{50}$
  0.5 nm/$Ni_{80}Fe_{20}$ 3 nm/$Co_{90}Fe_{10}$ 1 nm/Cu 1 nm/Ta 10 nm Sample D: Ta 5 nm/NiFeCr 5 nm/PtMn 15 nm/$(Co_{90}Fe_{10})_{90}$ $Cr_{10}$ 3 nm/Ru
  1 nm/$Fe_{50}Co_{50}$ 2.5 nm/$Fe_{80}Co_{20}$ 1 nm/Cu
  0.2 nm/$(Cu_{10}Al_{90})$—O 0.8 nm/Cu 0.2 nm/$Fe_{50}Co_{50}$
  0.5 nm/$Ni_{80}Fe_{20}$ 3 nm/$Co_{90}Fe_{10}$ nm/Cu 1 nm/Ta 10 nm Oxidization intensity of Samples C and D is 30 k Langmuires. In Sample A having no resistance adjusting layer, output A$\Delta$R was 1.5 m$\Omega\mu m^2$, but in Sample C having the resistance adjusting layer 38, A$\Delta$R was 15 m$\Omega\mu m^2$. Even in structures similarly having such resistance adjusting layers 38, A$\Delta$R was 15 m$\Omega\mu m^2$ in Sample C having the thin-film insertion layers 32 and 34, but A$\Delta$R was 10 m$\Omega\mu m^2$ in Sample B removing the thin-film insertion layers 32 and 34 to equalize the total film thickness. It has been confirmed from these facts that the thin-film insertion layers 32 and 34 and the resistance adjusting layer 38, when combined, collaborate to enhance the effect.

In Sample D using an oxide of $Cu_{10}Al_{90}$ alloy as the resistance adjusting layer 38, A$\Delta$R was as large as 16 m$\Omega\mu m^2$, and an effect of current confinement and the interface insertion layers 32 and 34 was confirmed. Additionally, some samples having the same film configuration as Sample C were prepared by changing the oxidation process as follows.

Sample E: oxidization by radical oxygen (oxidization intensity: 800 Langmuires)
Sample F: plasma oxidation (oxidization intensity: 800 Langmuires)
Sample G: oxidization under irradiation of Ar ion beams (oxidization intensity: 800 Langmuires)
Sample H: oxidization after irradiation of Ar ion beams (oxidization intensity: 3k Langmuires)

As a result, in the order of Samples E, F and G, A$\Delta$R was 20 m$\Omega\mu m^2$, 50 m$\Omega\mu m^2$ and 50 m$\Omega\mu m^2$ probably because the current path in the resistance adjusting layer 38 became more conductive and the insulating portion was conversely enhanced in insulating performance. Furthermore, Samples C, E, F and G were additionally annealed. As a result, the output A$\Delta$R increased up to 20 m$\Omega\mu m^2$, 40 m$\Omega\mu m^2$, 80 m$\Omega\mu m^2$ and 80 m$\Omega\mu m^2$, respectively.

Similar improvement of A$\Delta$R has been observed in the magnetoresistance effect elements where the resistance adjusting layer 38 includes an oxide of at least one kind of element selected from the group consisting of boron (B), silicon (Si), germanium (Ge), tantalum (Ta), tungsten (W), niobium (Nb), aluminum (Al), molybdenum (Mo), phosphorus (P), vanadium (V), arsenic (As), antimony (Sb), zirconium (Zr), titanium (Ti), zinc (Zn), lead (Pb), thorium (Th), beryllium (Be), cadmium (Cd), scandium (Sc), lanthanum (La), yttrium (Y), praseodymium (Pr), chromium (Cr), tin (Sn), gallium (Ga), indium (In), rhodium (Rh), magnesium (Mg), lithium (Li), barium (Ba), calcium (Ca), strontium (Sr), manganese (Mn), iron (Fe), cobalt (Co), nickel (Ni), rubidium (Rb) and rare earth metals, as major component thereof, and the oxide includes an element selected from the group consisting of copper (Cu), gold (Au), silver (Ag), platinum (Pt), palladium (Pd), iridium (Ir) and osmium (Os) not less than 1 atomic % and not exceeding 50 atomic %.

TWENTY-SECOND EXAMPLE

Figure 24:
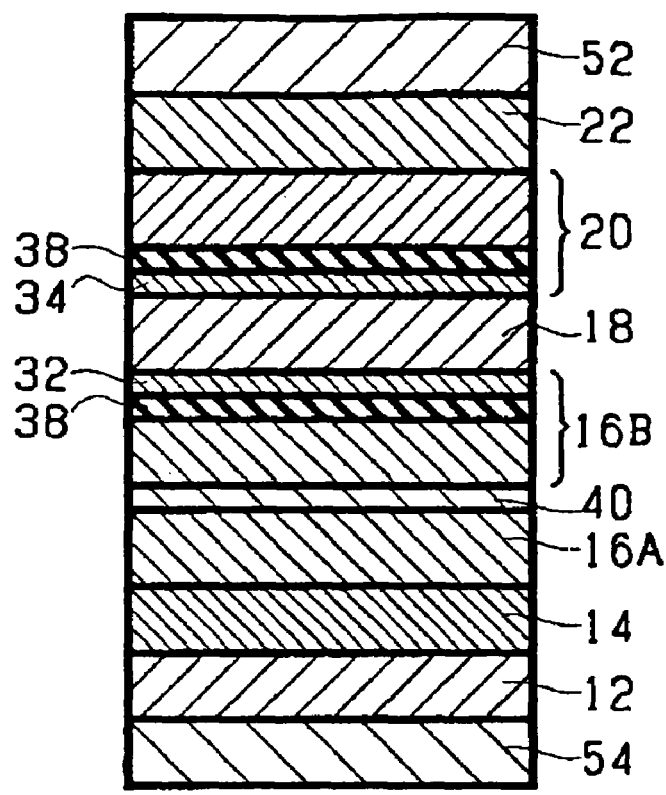
FIG. 24 is a diagram that schematically shows a cross-sectional structure of a magnetoresistance effect element having a resistance adjusting layer.

FIG. 24 is a diagram that schematically shows a cross-sectional structure of a magnetoresistance effect element having a resistance adjusting layer. A resistance adjusting layer 38 having a high-resistance made by oxidizing a $Cu_{10}Cr_{90}$ alloy is inserted in the magnetically pinned layer 16B and the magnetically free layer 20, respectively. The resistance adjusting layers 38 locally includes low-resistance, conductive regions as pin holes, and the sense current by perpendicular current supply will concentrically flows into the pinholes. As a result, its effective current-supply region is narrowed, and it results in increasing the output. If only a current-supply region exhibiting large spin-dependent scattering can be narrowed, the increase of the resistance change (A$\Delta$R) will increase relative to the increase of the entire resistance value (AR), and the ratio of resistance change (MR=A$\Delta$R/AR) will increase accordingly. Therefore, larger effect is expected by combining a spin valve element according to the embodiment of the invention having thin-film insertion layers 32 and 34 with large spin-dependent scattering along the interface. Using a SyAF structure, samples with and without the resistance adjusting layers 38 and with and without the interface insertion layers 32 and 34 were compared.

Sample A: Ta 5 nm/NiFeCr 5 nm/PtMn 15 nm/$(Co_{90}Fe_{10})_{90}$ $Cr_{10}$ 3 nm/Ru
  1 nm/$Fe_{50}Co_{50}$ 2.5 nm/$Fe_{80}Co_{20}$ 1 nm/Cu 2 nm/$Fe_{50}Co_{50}$ 0.5
  nm/$Ni_{80}Fe_{20}$ 3 nm/$Co_{90}Fe_{10}$ 1 nm/Ta 10 nm Sample B: Ta 5 nm/NiFeCr 5 nm/PtMn 15 nm/$(Co_{90}Fe_{10})_{90}$ $Cr_{10}$ 3 nm/Ru
  1 nm/$Fe_{50}Co_{50}$ 2.5 nm/$(Cu_{10}Cr_{90})$—O 0.8 nm/$Fe_{80}Co_{20}$
  1 nm/Cu 2 nm/$Fe_{50}Co_{50}$ 0.5 nm/$Ni_{80}Fe_{20}$ 3 nm/$Co_{90}Fe_{10}$
  1 nm/Cu 1 nm/Ta 10 nm Sample C: Ta 5 nm/NiFeCr 5 nm/PtMn 15 nm/$(Co_{90}Fe_{10})_{90}$$Cr_{10}$ 3 nm/Ru
  1 nm/$Fe_{50}Co_{50}$ 2.5 nm/$Fe_{80}Co_{20}$ 0.5 nm/$(Cu_{10}Cr_{90})$—O 0.8 nm/$Fe_{80}Co_{20}$ 0.5 nm/Cu 2 nm/$Fe_{50}Co_{50}$ 0.5 nm/$Ni_{80}Fe_{20}$
  3 nm/$Co_{90}Fe_{10}$ 1 nm/Cu 1 nm/Ta 10 nm Sample D: Ta 5 nm/NiFeCr 5 nm/PtMn 15 nm/$(Co_{90}Fe_{10})_{90}$$Cr_{10}$ 3 nm/Ru
  1 nm/$Fe_{50}Co_{50}$ 2.5 nm/$Fe_{80}Co_{20}$ 0.5 nm/$(Cu_{10}Cr_{90})$—O 0.8 nm/$Fe_{80}Co_{20}$ 0.5 nm/Cu 2 nm/$Fe_{50}Co_{50}$
  0.5 nm//$(Cu_{90}Cr_{10})$—O 0.8 nm/$Ni_{80}Fe_{20}$ 3 nm/$Co_{90}Fe_{10}$ 1 nm/Cu 1 nm/Ta 10 nm Sample E: Ta 5 nm/NiFeCr 5 nm/PtMn 15 nm/$(Co_{90}Fe_{10})_{90}$$Cr_{10}$ 3 nm/Ru
  1 nm/$Fe_{50}Co_{50}$ 2.5 nm/$Fe_{80}Co_{20}$ 0.5 nm/$(Cu_{10}Al_{90})$—O 0.8 nm/$Fe_{80}CO_{20}$ 0.5 nm/Cu 2 nm/$Fe_{50}CO_{50}$
  0.5 nm//$(Cu_{90}Cr_{10})$—O 0.8 nm/$Ni_{80}Fe_{20}$ 3 nm/$Co_{90}Fe_{10}$ 1 nm/Cu 1 nm/Ta 10 nm In Sample A having no resistance adjusting layer, output AΔR was 1.5 mΩμ², but in Sample B having the resistance adjusting layer 38 in the pinned layer 16B, AΔR was 8 mΩμm². In Sample C, AΔR was 12 mΩμm². In Sample D inserting the resistance adjusting layer 38 also in the free layer 20, AΔR increased to 20 mΩμm². As such, the output can be increased by inserting the resistance adjusting layer 38 in one or more magnetic layers, particularly near the non-magnetic intermediate layer 18. Also in Sample E using an oxidized $Cu_{10}Cl_{90}$ as the resistance-adjusting layer, AΔR reached 25 mΩμm².

Similar improvement of AΔR has been observed in the magnetoresistance effect elements where the resistance adjusting layer 38 includes an oxide of at least one kind of element selected from the group consisting of boron (B), silicon (Si), germanium (Ge), tantalum (Ta), tungsten (W), niobium (Nb), aluminum (Al), molybdenum (Mo), phosphorus (P), vanadium (V), arsenic (As), antimony (Sb), zirconium (Zr), titanium (Ti), zinc (Zn), lead (Pb), thorium (Th), beryllium (Be), cadmium (Cd), scandium (Sc), lanthanum (La), yttrium (Y), praseodymium (Pr), chromium (Cr), tin (Sn), gallium (Ga), indium (In), rhodium (Rh), magnesium (Mg), lithium (Li), barium (Ba), calcium (Ca), strontium (Sr), manganese (Mn), iron (Fe), cobalt (Co), nickel (Ni), rubidium (Rb) and rare earth metals, as major component thereof, and the oxide includes an element selected from the group consisting of copper (Cu), gold (Au), silver (Ag), platinum (Pt), palladium (Pd), iridium (Ir) and osmium (Os) not less than 1 atomic % and not exceeding 50 atomic %.

TWENTY-THIRD EXAMPLE

In this example, effects of thin-film insertion layers and back insertion layer in so-called "dual type" magnetoresistance effect elements were confirmed.

Figure 25:
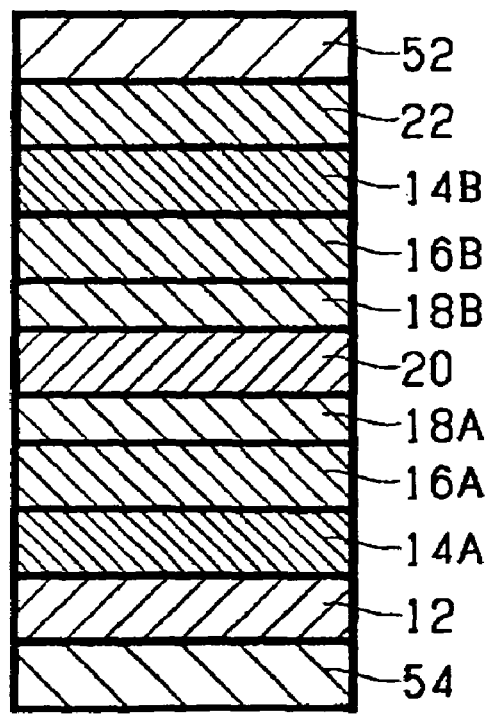
FIG. 25 is a diagram that schematically shows a cross-sectional structure of a dual type magnetoresistance effect element.

FIG. 25 is a diagram that schematically shows a cross-sectional structure of a dual type magnetoresistance effect element. The magnetoresistance effect element shown here has a structure sequentially depositing, in the written order, the lower electrode 54, base layer 12, first anti-ferromagnetic layer 14A, first pinned layer 16A, first nonmagnetic intermediate layer 18A, free layer 20, second nonmagnetic intermediate layer 18B, second pinned layer 16B, second anti-ferromagnetic layer 14B, protective layer 22 and upper electrode 52.

Also in the magnetoresistance effect elements having this dual structure, the effect of increasing the magnetoresistance change by the thin-film insertion layers 32, 34 and back insertion layer 36 was confirmed similarly to the foregoing examples, and they exhibited magnetoresistance change as large as 1.5 to 3 times that of a standard magnetoresistance effect element having a pair of pinned layer and free layer.

TWENTY-FOURTH EXAMPLE

In this example, magnetoresistance effect elements having the pinned layer and the free layer each in form of a multi-layered structure alternately depositing a ferromagnetic layer and a nonmagnetic layer were prepared, and effects by insertion of the thin-film insertion layer and back insertion layer were confirmed.

FIG. 4 is a diagram that schematically illustrates a cross-sectional structure of the magnetoresistance effect element according to the instant example. This magnetoresistance effect element has a multi-layered structure sequentially depositing, in the written order, the lower electrode 54, base layer 12, anti-ferromagnetic layer 14, pinned layer 16 in form of a multi-layered structure alternately depositing a ferromagnetic layer F and a nonmagnetic layer N, nonmagnetic intermediate layer 18, free layer 20 in form of a multi-layered structure alternately depositing a ferromagnetic layer F and a nonmagnetic layer N, protective layer 22 and upper electrode 52.

In each of the pinned layer 16 and the free layer 20 of this element, ferromagnetic layers F get into ferromagnetic coupling with each other via the nonmagnetic layer N.

Also in the magnetoresistance effect elements having this multi-layered structure, the effect of increasing the magnetoresistance change by the thin-film insertion layers 32, 34 and back insertion layer 36 was confirmed similarly to the foregoing examples. That is, in this example, the change of magnetoresistance was increased by using a thin-film insertion layer having the composition and the crystal structure explained in any one of the foregoing examples to form one or more of the ferromagnetic layers F forming the pinned layer 16 and the free layer 20, respectively.

TWENTY-FIFTH EXAMPLE

In this example, magnetoresistance effect elements having the pinned layer and the free layer each in form of a multi-layered structure alternately depositing two different kinds of ferromagnetic layers F1, F2 were prepared, and effects by insertion of the thin-film insertion layer and back insertion layer were confirmed.

FIG. 5 is a diagram that schematically illustrates a cross-sectional structure of the magnetoresistance effect element according to this example. This magnetoresistance effect element has a multi-layered structure sequentially depositing, in the written order, the lower electrode 54, base layer 12, anti-ferromagnetic layer 14, pinned layer 16 in form of a multi-layered structure alternately depositing the first ferromagnetic layer F1 and the second ferromagnetic layer F2, nonmagnetic intermediate layer 18, free layer 20 in form of a multi-layered structure alternately depositing the first ferromagnetic layer F1 and the second ferromagnetic layer F2, protective layer 22 and upper electrode 52.

Also in the magnetoresistance effect elements having this multi-layered structure, the effect of increasing the magnetoresistance change by the thin-film insertion layers 32, 34 and back insertion layer 36 was confirmed similarly to the foregoing examples. That is, in this example, the change of magnetoresistance was increased by using a thin-film insertion layer having the composition and the crystal structure explained in any one of the foregoing examples to form one of the first and second ferromagnetic layers F1, F2 forming the pinned layer 16 and the free layer 20, respectively.

TWENTY-SIXTH EXAMPLE

Next explained is the twenty-sixth example of the invention, which is a magnetic reproducing apparatus having inboard any of the magnetoresistance effect element explained with reference to FIGS. 1 through 25.

Figure 26:
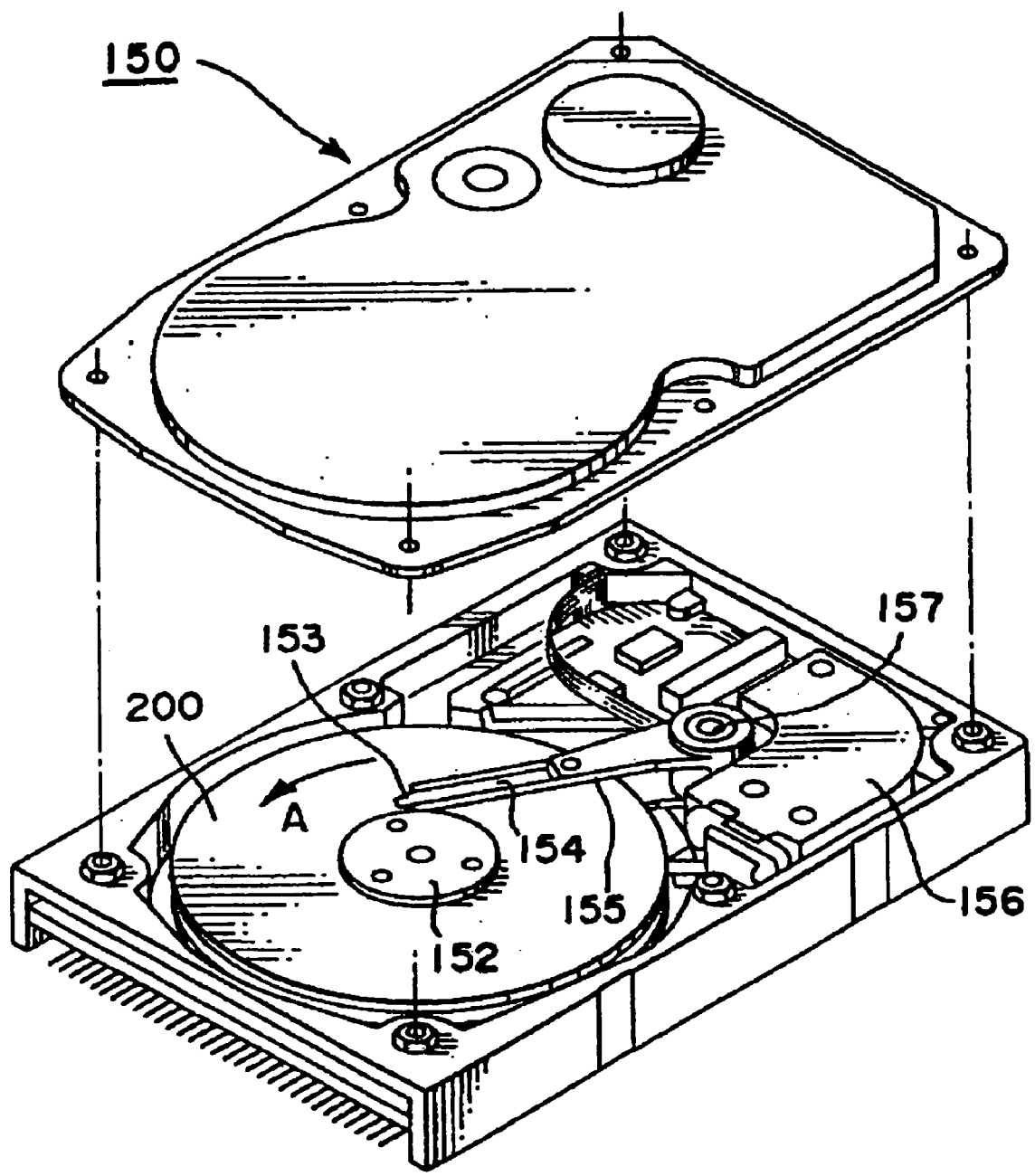
FIG. 26 is a perspective view that shows general configuration of the substantial part of a magnetoresistance effect element according to an embodiment of the invention.

FIG. 26 is a perspective view that shows outline configuration of this kind of magnetic reproducing apparatus. The magnetic reproducing apparatus 150 shown here is of a type using a rotary actuator. A magnetic reproducing medium disk 200 is mounted on a spindle 152 and rotated in the arrow A direction by a motor, not shown, which is responsive to a control signal from a controller of a driving mechanism, not shown. The magnetic reproducing apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistance effect element or magnetic head, for example, according to one of the foregoing embodiments of the invention, near the distal end thereof.

Once the medium disk 200 rotates, the medium-facing surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator arm 155 is supported by ball bearings, not shown, which are located at upper and lower two positions of the spindle 157 and driven by the voice coil motor 156 for rotating, sliding movements.

Figure 27:
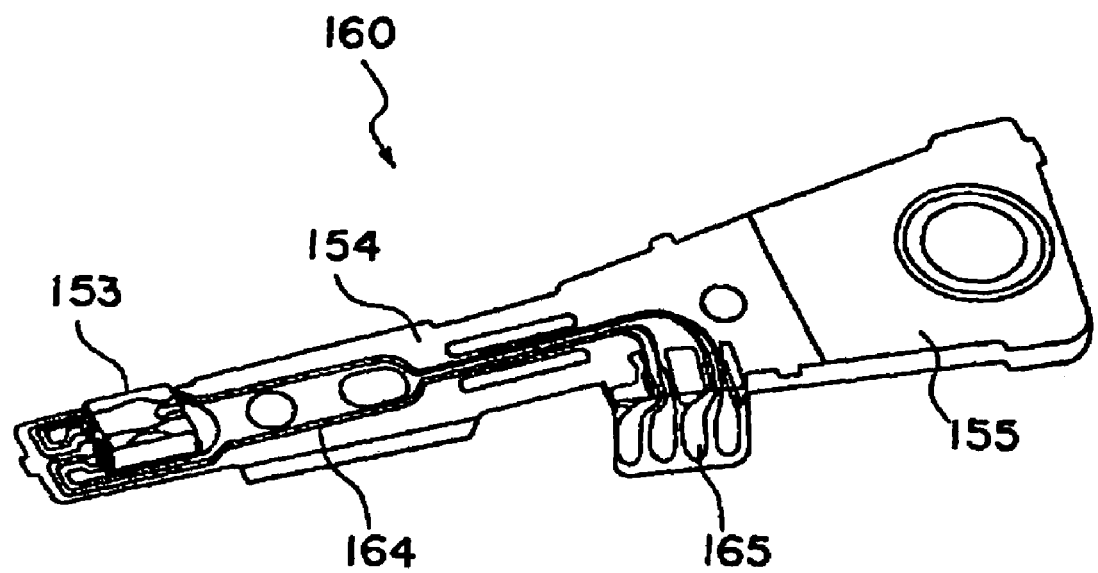
FIG. 27 is an enlarged, perspective view of a distal end from an actuator arm 155 of a magnetic head assembly.

FIG. 27 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistance effect element as explained with reference to FIGS. 1 through 25 is provided. The suspension 154 has a lead 164 for writing and reading signals, and the lead line 164 is connected to electrodes of the magnetic head incorporated in the head slider 153. Numeral 165 in FIG. 27 denotes an electrode pad of the magnetic head assembly 160.

In this embodiment, one of the magnetoresistance effect elements already explained in conjunction with the aforementioned embodiments is used as the magnetoresistance effect element, information magnetically recorded on the medium disk 200 under a higher recording density than before can be read reliably.

Heretofore, some embodiments of the invention have been explained with reference to specific examples. However, the invention is not limited to these specific examples.

For example, as to laminating configuration of the components composing the magnetiresistive effect element, such as the specific size, shape or positional relationship of the electrode, bias magnetic field applying film or insulating layer can be selected from the known art. The invention encompasses any such changes by persons skilled in the art provided they attain the effects of respective embodiments of the invention.

The each components of the magnetoresistance effect element such as the antiferromagnetic layer, magnetically pinned layer, nonmagnetic spacer layer or magnetically free layer can be made of a single layer or made of multiplayer including a plurality of films.

When the magnetoresistance effect element according to the present invention is applied to a reproducing head, a recording-reproducing integrated magnetic head may be realized by combining a recording head therewith.

Further, the magnetic reproducing apparatus according to the present invention may be of a fixed type in which specific magnetic recording medium is permanently installed, while it may be of a removable type in which the magnetic recording medium can be replaced easily.

Further, the magnetoresistance effect element according to the present invention can be advantageously used for a magnetic memory such as magnetic random access memory (MRAM).

As described above, embodiments of the invention can increase the resistance change by inserting a thin-film insertion layer or back insertion layer having a unique composition or crystal structure in the magnetoresistance effect film of a CPP type magnetoresistance effect element having a pin valve structure, and can realize highly sensitive read that cannot be realized with a conventional CPP type magnetoresistance effect element having a spin valve structure.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistance effect element comprising:
    a magnetoresistance effect film including a magnetically pinned layer having a magnetic material film whose direction of magnetization is pinned substantially in one direction, a magnetically free layer having a magnetic material film whose direction of magnetization changes in response to an external magnetic field, a nonmagnetic metal intermediate layer located between said pinned layer and said free layer, and an antiferromagnetic layer configured to pin said magnetization of said magnetically pinned layer; and
    a pair of electrodes electrically connected to said magnetoresistance effect film to supply a sense current perpendicularly to a film plane of said magnetoresistance effect film,
    at least one of said pinned layer and said free layer including a thin-film insertion layer, and said thin-film insertion layer being made of a binary or ternary alloy of iron (Fe), cobalt (Co) and nickel (Ni) containing a quantity of iron (Fe) not less than 50 atomic % in case of said binary alloy or 25% atomic % in case of said ternary alloy, and additionally containing a quantity of at least one kind of element selected from the group consisting of copper (Cu), silver (Ag), and gold (Au) not less than 0.1 atomic % and not exceeding 30 atomic %.

2. The magnetoresistance effect element according to claim 1, wherein a back insertion layer made of copper (Cu), gold (Au), silver (Ag), or an alloy combining at least two kinds of these metals is provided adjacent to an interface of said free layer not in contact with said nonmagnetic intermediate layer.

3. A magnetic head comprising:
a magnetoresistance effect element comprising:
   a magnetoresistance effect film including a magnetically pinned layer having a magnetic material film whose direction of magnetization is pinned substantially in one direction, a magnetically free layer having a magnetic material film whose direction of magnetization changes in response to an external magnetic field, a nonmagnetic metal intermediate layer located between said pinned layer and said free layer, and an anti-ferromagnetic layer configured to pin said magnetization of said magnetically pinned layer; and
   a pair of electrodes electrically connected to said magnetoresistance effect film to supply a sense current perpendicularly to a film plane of said magnetoresistance effect film,
   at least one of said pinned layer and said free layer including a thin-film insertion layer, and
   said thin-film insertion layer being made of a binary or ternary alloy of iron (Fe), cobalt (Co) and nickel (Ni) containing a quantity of iron (Fe) not less than 50 atomic % in case of said binary alloy or 25% atomic % in case of said ternary alloy, and additionally containing a quantity of at least one kind of element selected from the group consisting of copper (Cu), silver (Ag), and gold (Au) not less than 0.1 atomic % and not exceeding 30 atomic %.

4. The magnetic head according to claim 3, wherein a back insertion layer made of copper (Cu), gold (Au), silver (Ag), or an alloy combining at least two kinds of these metals is provided adjacent to an interface of said free layer not in contact with said nonmagnetic intermediate layer.

5. A magnetic reproducing apparatus which reads information magnetically recorded in a magnetic recording medium, comprising:
a magnetic head having a magnetoresistance effect element comprising:
   a magnetoresistance effect film including a magnetically pinned layer having a magnetic material film whose direction of magnetization is pinned substantially in one direction, a magnetically, free layer having a magnetic material film whose direction of magnetization changes in response to an external magnetic field, a nonmagnetic metal intermediate layer located between said pinned layer and said free layer, and an anti-ferromagnetic layer configured to pin said magnetization of said magnetically pinned layer; and
   a pair of electrodes electrically connected to said magnetoresistance effect film to supply a sense current perpendicularly to a film plane of said magnetoresistance effect film,
   at least one of said pinned layer and said free layer including a thin-film insertion layer, and
   said thin-film insertion layer being made of a binary or ternary alloy of iron (Fe), cobalt (Co) and nickel (Ni) containing a quantity of iron (Fe) not less than 50 atomic % in case of said binary alloy or 25% atomic % in case of said ternary alloy, and additionally containing a quantity of at least one kind of element selected from the group consisting of copper (Cu), silver (Ag), and gold (Au) not less than 0.1 atomic % and not exceeding 30 atomic %.

6. The magnetic reproducing apparatus according to claim 5, wherein a back insertion layer made of copper (Cu), gold (Au), silver (Ag), or an alloy combining at least two kinds of these metals is provided adjacent to an interface of said free layer not in contact with said nonmagnetic intermediate layer.

7. The magnetoresistance effect element according to claim 1, wherein said thin-film insertion layer adjoins said nonmagnetic metal intermediate layer.

* * * * *